US012302543B2

(12) United States Patent
Chen et al.

(10) Patent No.: US 12,302,543 B2
(45) Date of Patent: May 13, 2025

(54) INTEGRATED CIRCUIT DEVICE WITH REDUCED VIA RESISTANCE

(71) Applicant: Taiwan Semiconductor Manufacturing Company, Ltd., Hsinchu (TW)

(72) Inventors: Jui-Lin Chen, Taipei (TW); Yu-Kuan Lin, Taipei (TW); Ping-Wei Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 870 days.

(21) Appl. No.: 17/461,322

(22) Filed: Aug. 30, 2021

(65) Prior Publication Data

US 2023/0062162 A1   Mar. 2, 2023

(51) Int. Cl.
*H10B 10/00*  (2023.01)
*H01L 23/528*  (2006.01)
*H01L 27/088*  (2006.01)

(52) U.S. Cl.
CPC ......... *H10B 10/12* (2023.02); *H01L 23/5283* (2013.01); *H01L 27/0886* (2013.01)

(58) Field of Classification Search
CPC . H10B 10/12; H01L 23/5226; H01L 27/0207; H01L 21/823481; H01L 21/823878
See application file for complete search history.

(56) References Cited

U.S. PATENT DOCUMENTS

| 7,586,147 | B2 | 9/2009 | Liaw |
| 8,693,235 | B2 | 4/2014 | Liaw |
| 8,908,421 | B2 | 12/2014 | Liaw |
| 9,236,300 | B2 | 1/2016 | Liaw |
| 9,607,685 | B2 | 3/2017 | Liaw |
| 9,646,973 | B2 | 5/2017 | Liaw |
| 9,653,563 | B2 * | 5/2017 | Liaw ................. H01L 29/78696 |
| 9,672,903 | B2 | 6/2017 | Liaw |
| 9,691,471 | B2 | 6/2017 | Liaw |

* cited by examiner

*Primary Examiner* — Tuan A Hoang
(74) *Attorney, Agent, or Firm* — HAYNES AND BOONE, LLP

(57) ABSTRACT

A device includes a substrate, a contact, a first gate, a second gate, a dielectric feature between the gates, a via, and a conductive line. The gates are each adjacent the contact and aligned lengthwise with each other along a first direction. A first sidewall of the dielectric feature defines an end-wall of the first gate. A second sidewall of the dielectric feature defines an end-wall of the second gate. The conductive line extends along a second direction. A projection of the conductive line onto a top surface of the dielectric feature passes between the first and second sidewalls. The via interfaces with the contact along a second plane. The via has a first dimension on the second plane along the second direction; the contact has a second dimension on the second plane along the second direction. The first dimension is greater than the second dimension.

20 Claims, 14 Drawing Sheets

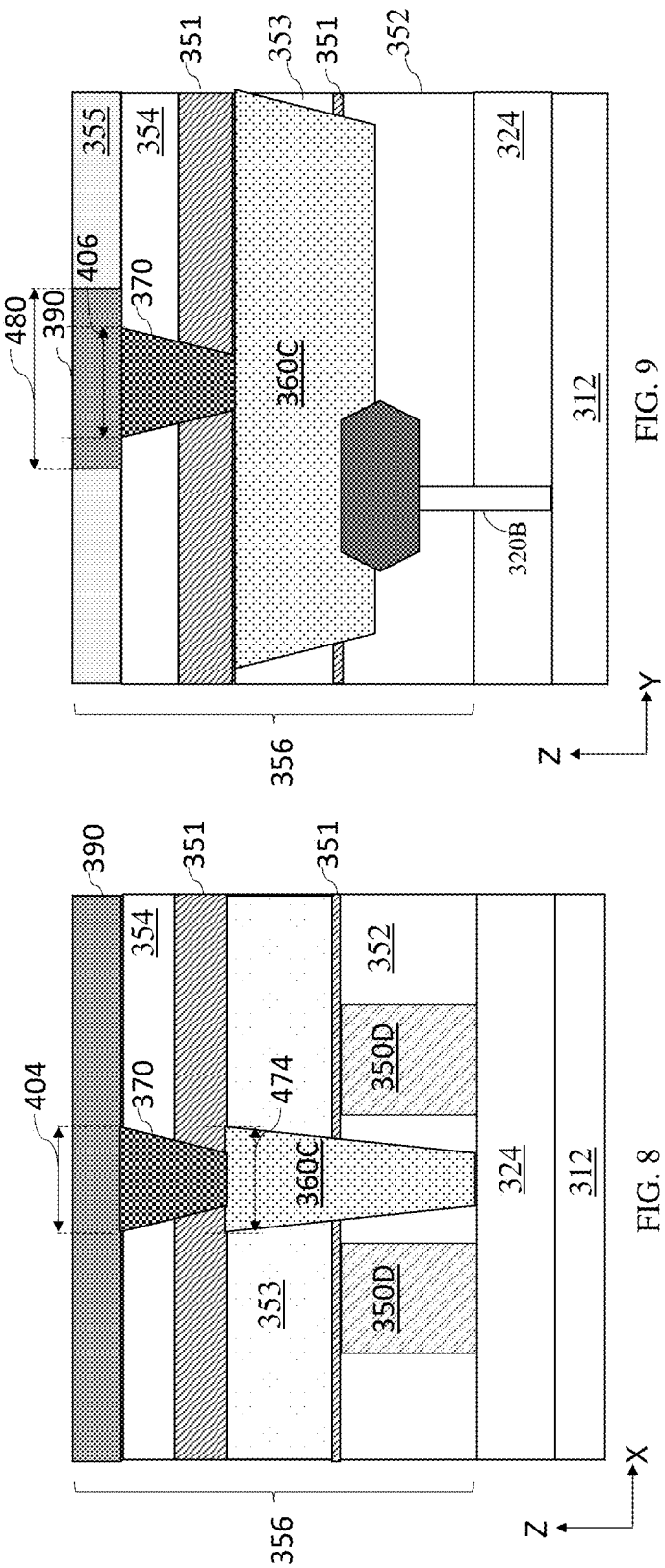

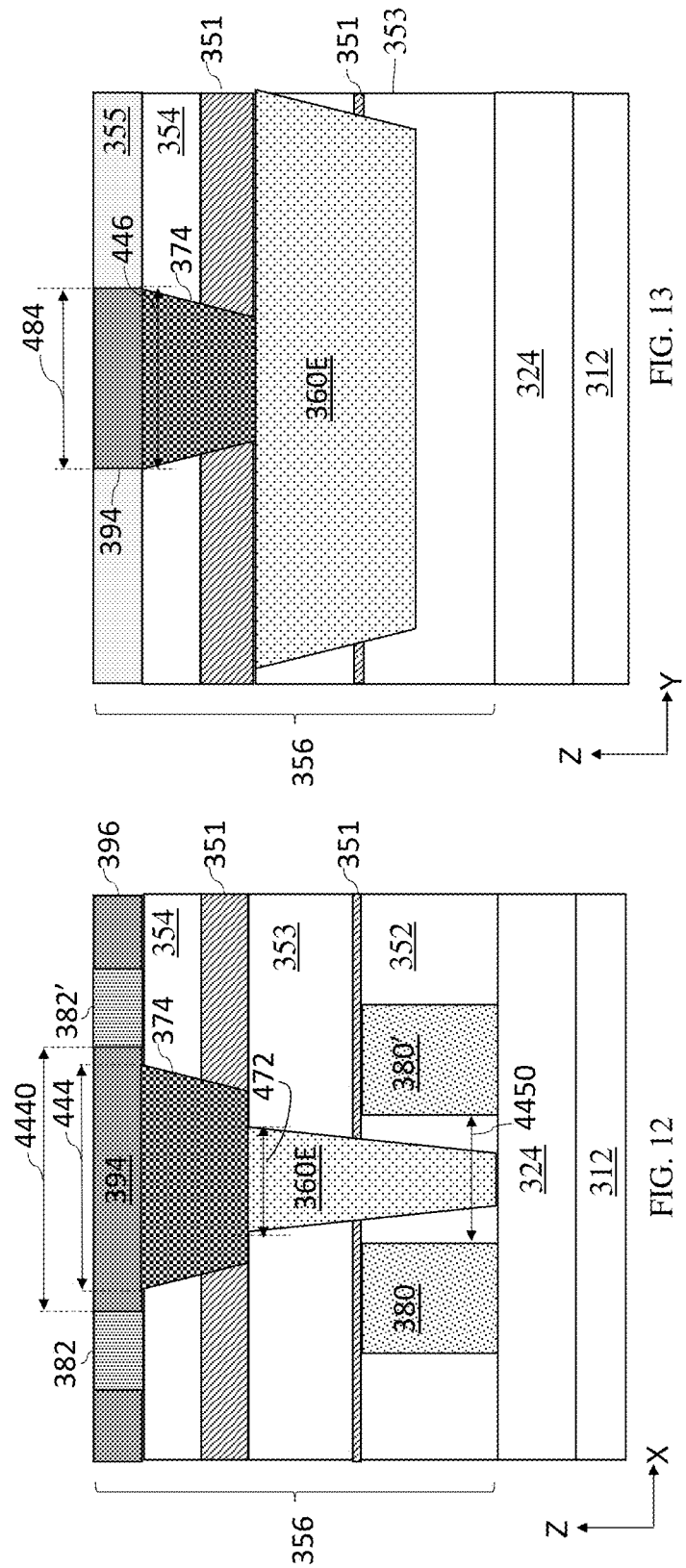

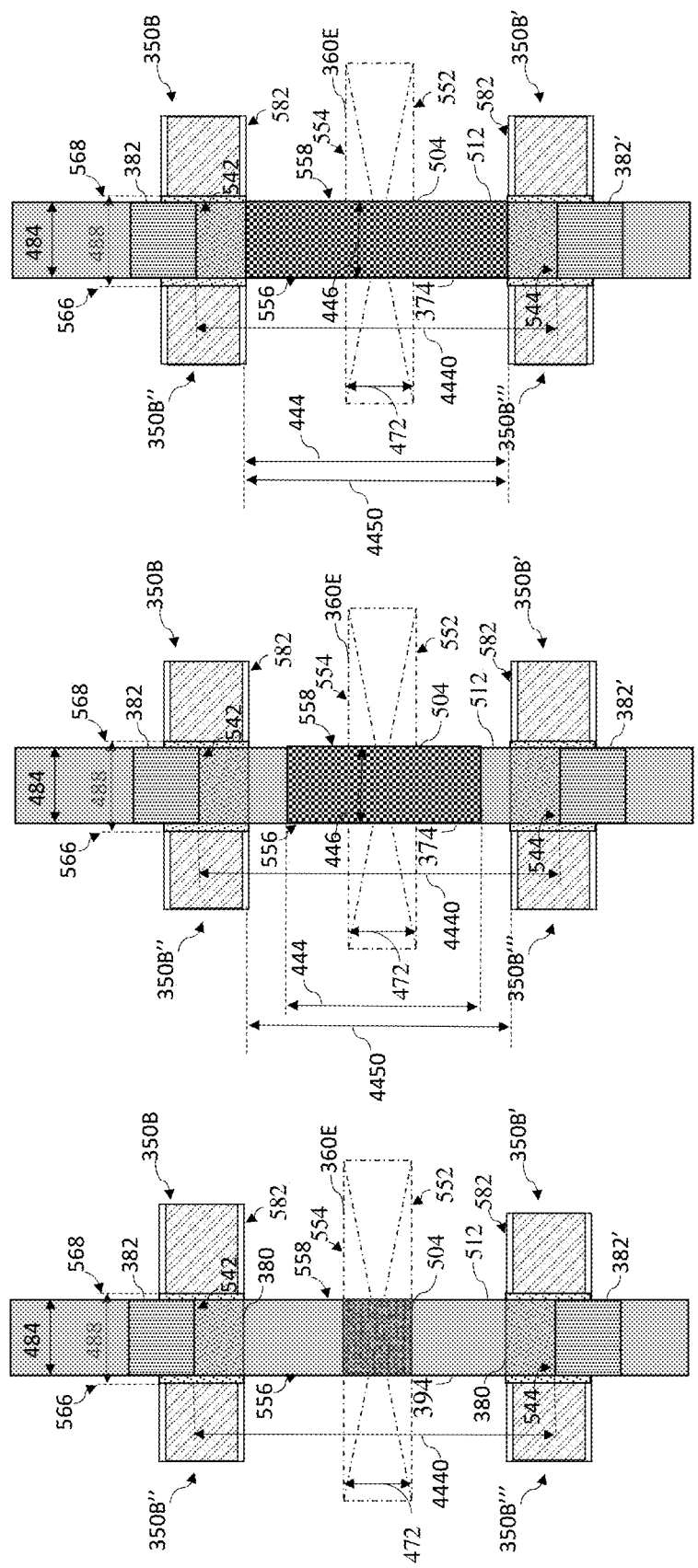

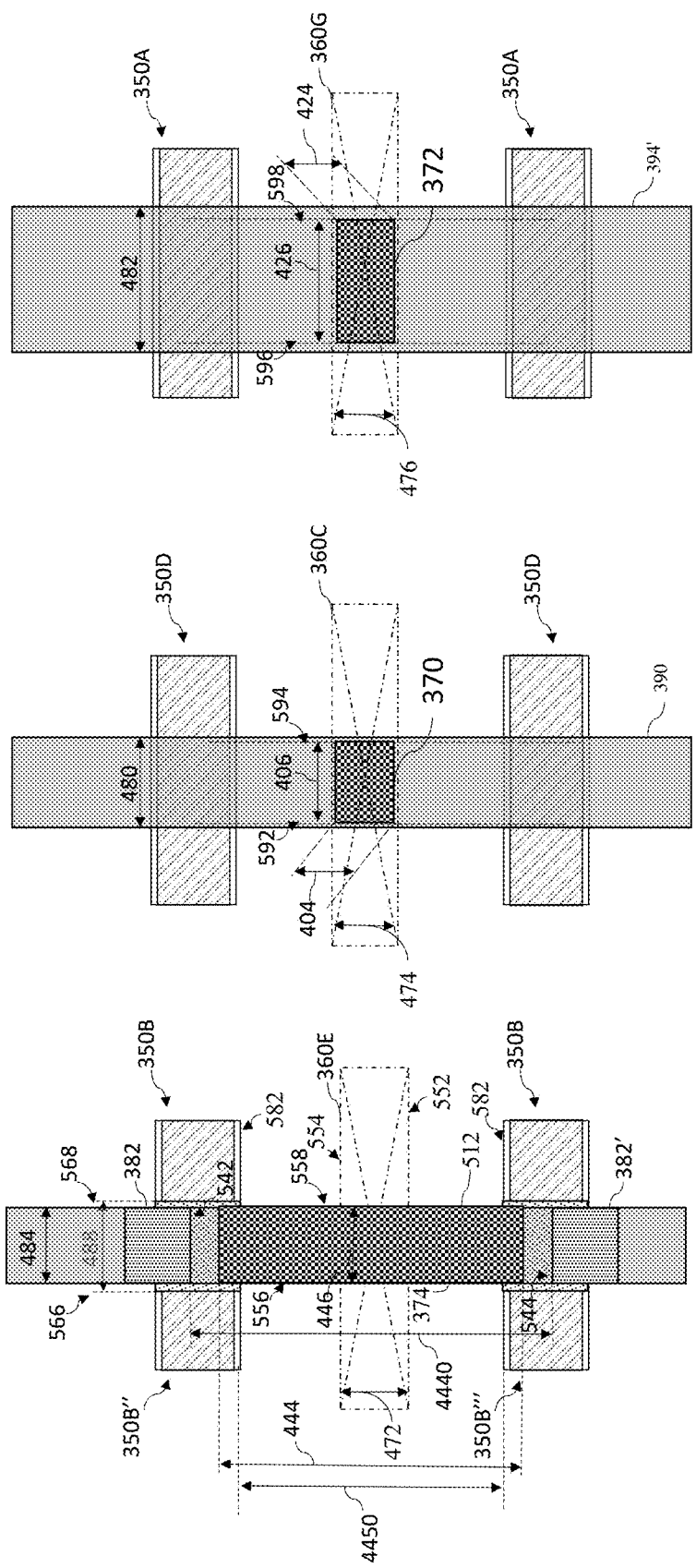

INTEGRATED CIRCUIT DEVICE WITH REDUCED VIA RESISTANCE

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of IC processing and manufacturing. For these advances to be realized, similar developments in IC processing and manufacturing are needed. For example, as feature sizes continue to scale down, it has become increasingly challenging to balance between device reliability and device performance. Accordingly, although existing technologies are generally adequate for their intended purposes, they are not satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 8, 9, 10, 11, 12, and 13 are fragmentary cross-sectional views of device features of the memory cell of FIG. 4 along various cross-sectional planes of FIG. 7, according to various aspects of the present disclosure.

FIGS. 14A, 14B, 15A, 15B, 16A, 16B, 16C, 17A, and 17B are expanded fragmentary cross-sectional views of various device features of the memory cell, according to various aspects of the present disclosure.

DETAILED DESCRIPTION

Figure 1:
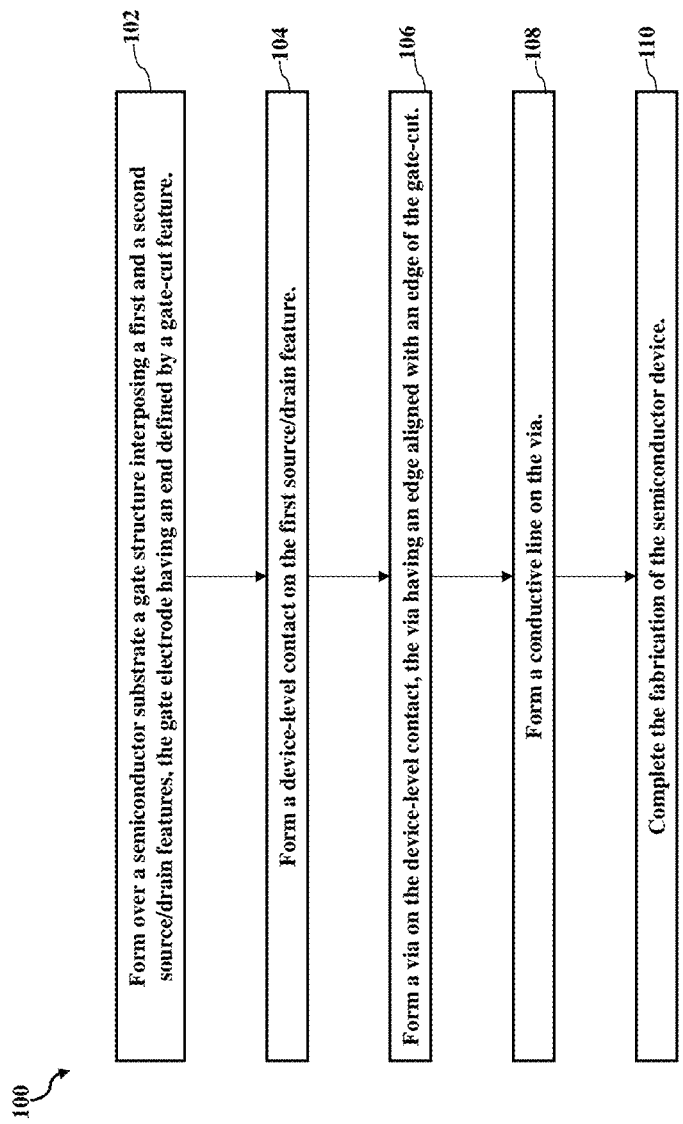
FIG. 1 is a flow chart of a method for fabricating an IC device according to various aspects of the present disclosure.

The present disclosure relates generally to integrated circuit (IC) devices, and more particularly, to IC devices with reduced via resistances and improved device performances.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As IC devices continue to scale down, it has become increasingly challenging to balance between device reliability and device performance. For example, via features (e.g. VD) are formed on device-level contacts to connect source/drain features to overlaying conductive lines. Because gate structures are often immediately next to the source/drain features, such via features are often designed to have small sizes to avoid inadvertently contacting the gate structures and forming short circuits. In other words, a smaller via feature is desired for the purpose of reducing OFF-state leakage current. However, such smaller via features have increased electrical resistances which degrade the device performance in many aspects. This challenge is exacerbated for devices that have more complex device structures, such as for memories. The present disclosure proposes improved memory structures that include via features having different sizes, designed based on their respective local environments so as to balance between the competing needs for greater performance and for less shorting risk. The present disclosure includes multiple embodiments. Different embodiments may have different advantages, and no particular advantage is necessarily required of any embodiment. Moreover, embodiments of the present disclosure may be implemented in IC devices built with any type of suitable transistors, such as planar field-effect transistors (FETs), multi-gate transistors (planar or vertical), such as fin-like FET (FinFET) devices, nano-sheet-based devices (including gate-all-around (GAA) devices, multi-bridge channel (MBC) devices, and other similar devices), omega-gate (Ω-gate) devices, or pi-gate (Π-gate) devices, as well as strained-semiconductor devices, silicon-on-insulator (SOI) devices, partially-depleted SOI devices, fully-depleted SOI devices, or other devices. Furthermore, the devices presented herein may be a complementary metal-oxide-semiconductor (CMOS) device, a p-type metal-oxide-semiconductor (pMOS) device, or an n-type metal-oxide-semiconductor (nMOS) device. Still further, although the present disclosure uses memory structure as examples to illustrate aspects of the invention, it contemplates that one of ordinary skill may recognize other IC devices beyond memory structures that can also benefit from the structure and methods described herein.

FIG. 1 is a flow chart of a method 100 for fabricating an IC device according to various aspects of the present disclosure. At block 102 of FIG. 1, method 100 includes forming transistors of a static-random access memory (SRAM) structure. For example, a first, a second, and a third transistor are formed on a semiconductor substrate. The first transistor has a first gate structure and first source/drain features over a first fin structure on the semiconductor substrate; the second transistor has a second gate structure and second source/drain features over a second fin structure on the semiconductor substrate; and a third transistor has a third gate structure and third source/drain features over a third fin structure on the semiconductor substrate. The first gate electrode extends lengthwise along a first direction, and an end of the first gate electrode is defined by a gate-cut feature. At block 104 of FIG. 1, the method 100 proceeds to form a first device-level contact on the first source/drain features, a second device-level contact on the second source/drain features, and a third device-level contact on the third source/drain features. At block 106 of FIG. 1, the method 100 proceeds to form a first via on the first device-level contact, a second via on the second device-level contact, and a third via on the third device-level contact. The first via is aligned with the gate-cut feature along a second direction that is perpendicular to the first direction. The first via has a first via dimension along the second direction, the second via has a second via dimension along the second direction, the third via has a third via dimension along the second direction, and the first via dimension is greater than the second and the third via dimension. At block 108, the method 100 proceeds to form a first conductive line over and connecting the first via to a source supply voltage, a second conductive line over and connecting the second via to a drain supply voltage, and a third conductive line to connect the third via to a bit line. The first conductive line has a line dimension along the second direction that matches the first dimension of the first via feature. At block 110, the method 100 proceeds to form additional features and complete the fabrication of the IC device. FIG. 1 has been simplified for the sake of clarity. These method steps may be better understood with reference to the following descriptions of device features.

Figure 2:
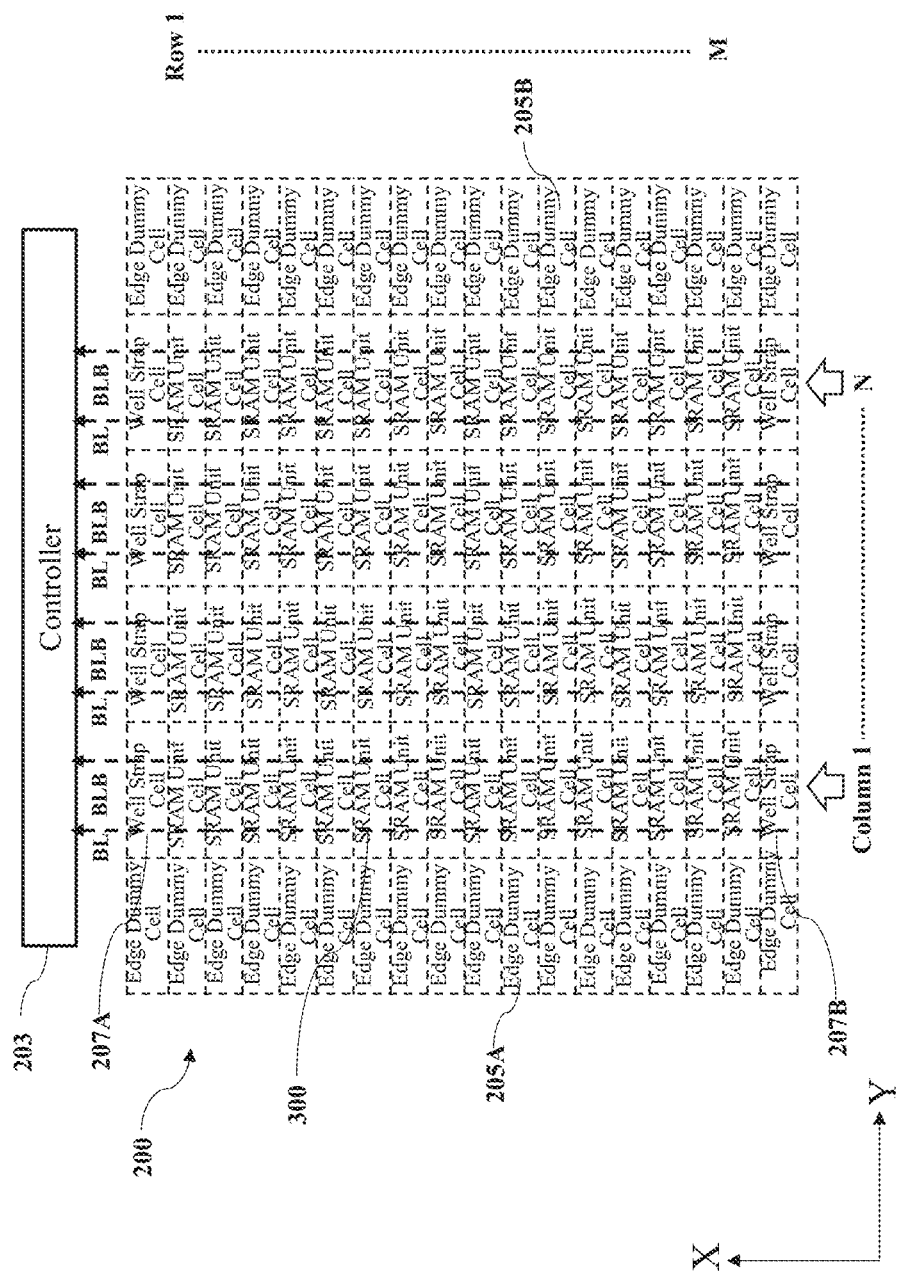
FIG. 2 is a plan view of an example memory array fabricated according to aspects of the present disclosure.

FIG. 2 is a plan view of an example memory array 200 fabricated according to aspects of the present disclosure. As illustrated in FIG. 2, the memory array 200 includes a plurality of memory cells 300 each bordering four additional cells (such as other memory cells 300 and/or dummy cells) on its boundaries. The memory cells 300 may be identical to, or symmetrically related to, each other. In some embodiments, some features of the memory cells 300 may be shared between the adjacent memory cells, such as across the cell boundaries. In the depicted embodiment, memory cell 300 is a static random access memory (SRAM) cells, thus is also referred to as SRAM 300. However, the present disclosure contemplates embodiments, where memory cell 300 includes another type of memory, such as a dynamic random access memory (DRAM), a non-volatile random access memory (NVRAM), a flash memory, or other suitable memory. Memory array 200 may be included in a microprocessor, a memory, and/or other IC device. In some implementations, memory array 200 may be a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. FIG. 2 has been simplified for the sake of clarity to better understand the inventive concepts of the present disclosure. Additional features can be added in memory array 200, and some of the features described can be replaced, modified, or eliminated from the memory array 200.

The memory cells 300 are arranged in column 1 to column N each extending along a first direction (here, in an X-direction) and row 1 to row M each extending along a second direction (here, in a Y-direction), where N and M are positive integers. Column 1 to column N each include a bit line pair extending along the first direction, such as a bit line (BL) and a bit line bar (BLB) (also referred to as a complementary bit line), that facilitate reading data from and/or writing data to respective memory cells 300 in true form and complementary form on a column-by-column basis. Row 1 to row M each includes a word line (WL) (not shown) that facilitates access to respective memory structures 300 on a row-by-row basis. Each memory cell 300 is electrically connected to a respective BL, a respective BLB, and a respective WL, which are electrically connected to a controller 203. Controller 203 is configured to generate one or more signals to select at least one WL and at least one bit line pair (here, BL and BLB) to access at least one of memory cells 300 for read operations and/or write operations. Controller 203 includes any circuitry suitable to facilitate read/write operations from/to memory cells 300, including but not limited to, a column decoder circuit, a row decoder circuit, a column selection circuit, a row selection circuit, a read/write circuit (for example, configured to read data from and/or write data to memory cells 300 corresponding to a selected bit line pair (in other words, a selected column)), other suitable circuit, or combinations thereof. In some implementations, the controller 203 includes at least one sense amplifier configured to detect and/or amplify a voltage differential of a selected bit line pair. In some implementations, the sense amplifier is configured to latch or otherwise store data values of the voltage differential. A perimeter of memory array 200 is configured with dummy cells, such as edge dummy cells 205A, 205B, and well strap cells 207A, 207B, to ensure uniformity in performance of memory array 200. However, in some embodiments, the perimeter of memory arrays 200 may include functional memory cells, such as SRAM cells 300.

Figure 3:
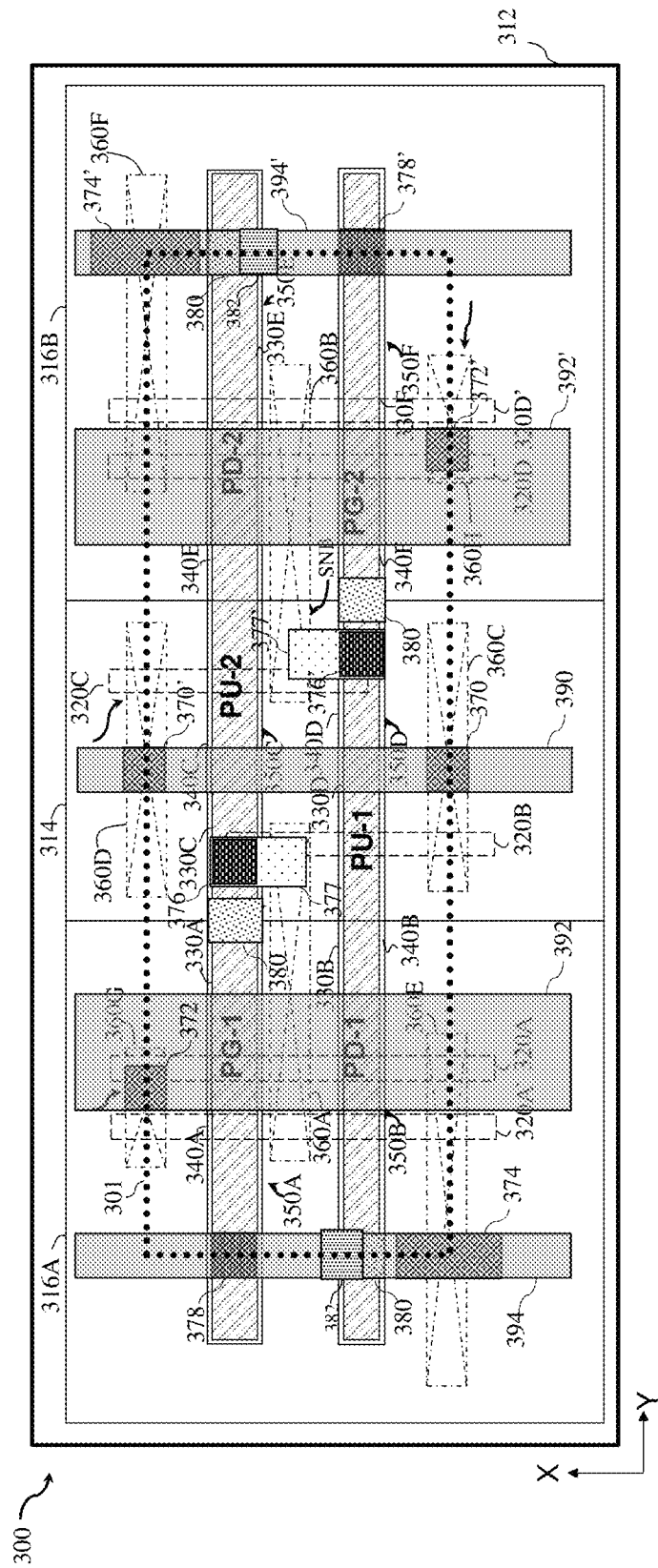
FIG. 3 is a plan view of a memory cell, such as a memory cell of the example memory array of FIG. 2, in portion or entirety, according to various aspects of the present disclosure.
Figure 4:
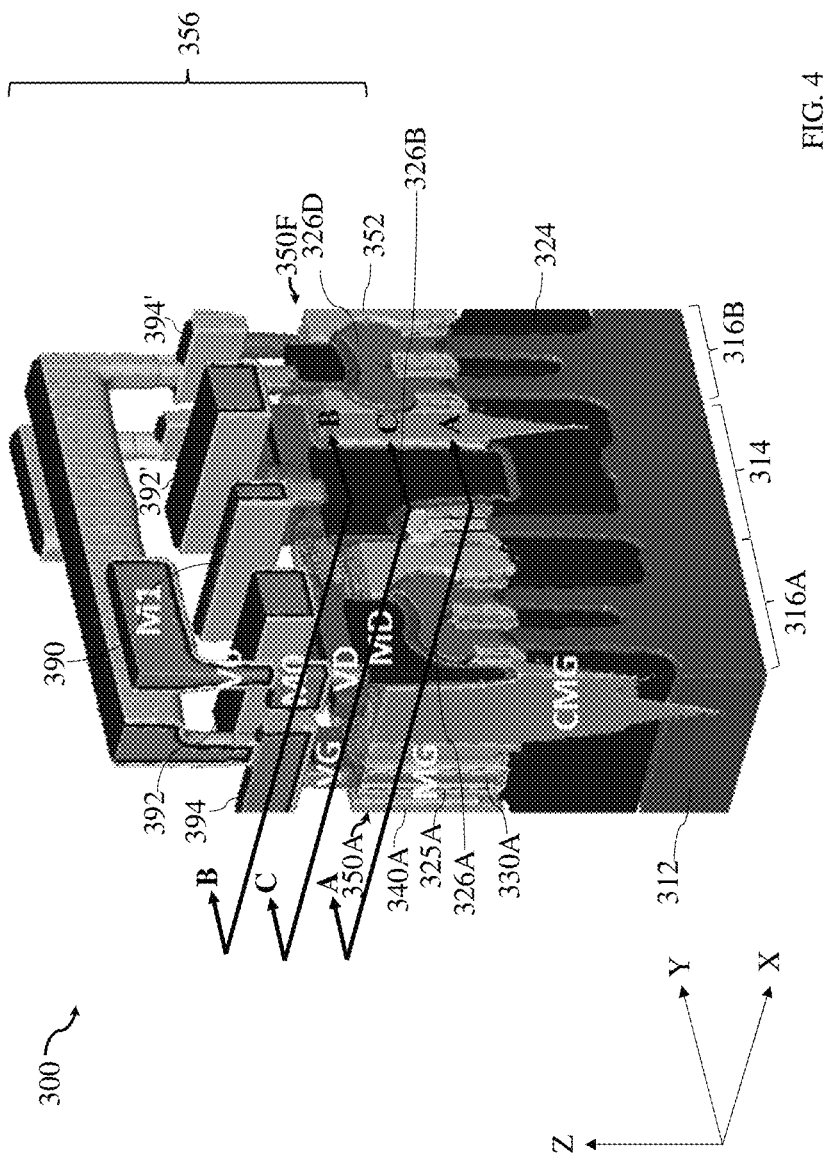
FIG. 4 is a three-dimensional (3D) perspective view of a memory cell, such as the memory cell of FIG. 3, according to various aspects of the present disclosure.
Figure 5:
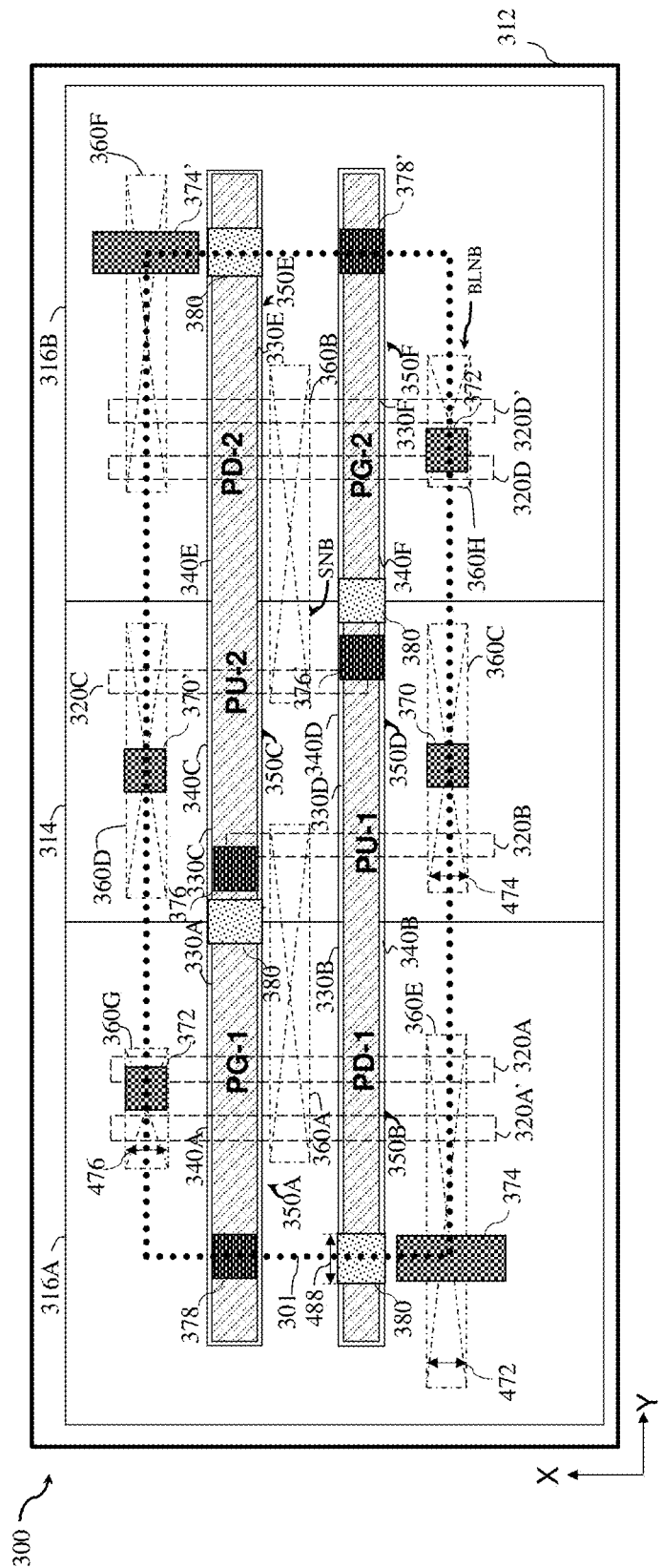
FIGS. 5, 6, and 7 are fragmentary cross-sectional views of the memory cell of FIG. 4 along various planes of FIG. 4, according to various aspects of the present disclosure.
Figure 6:
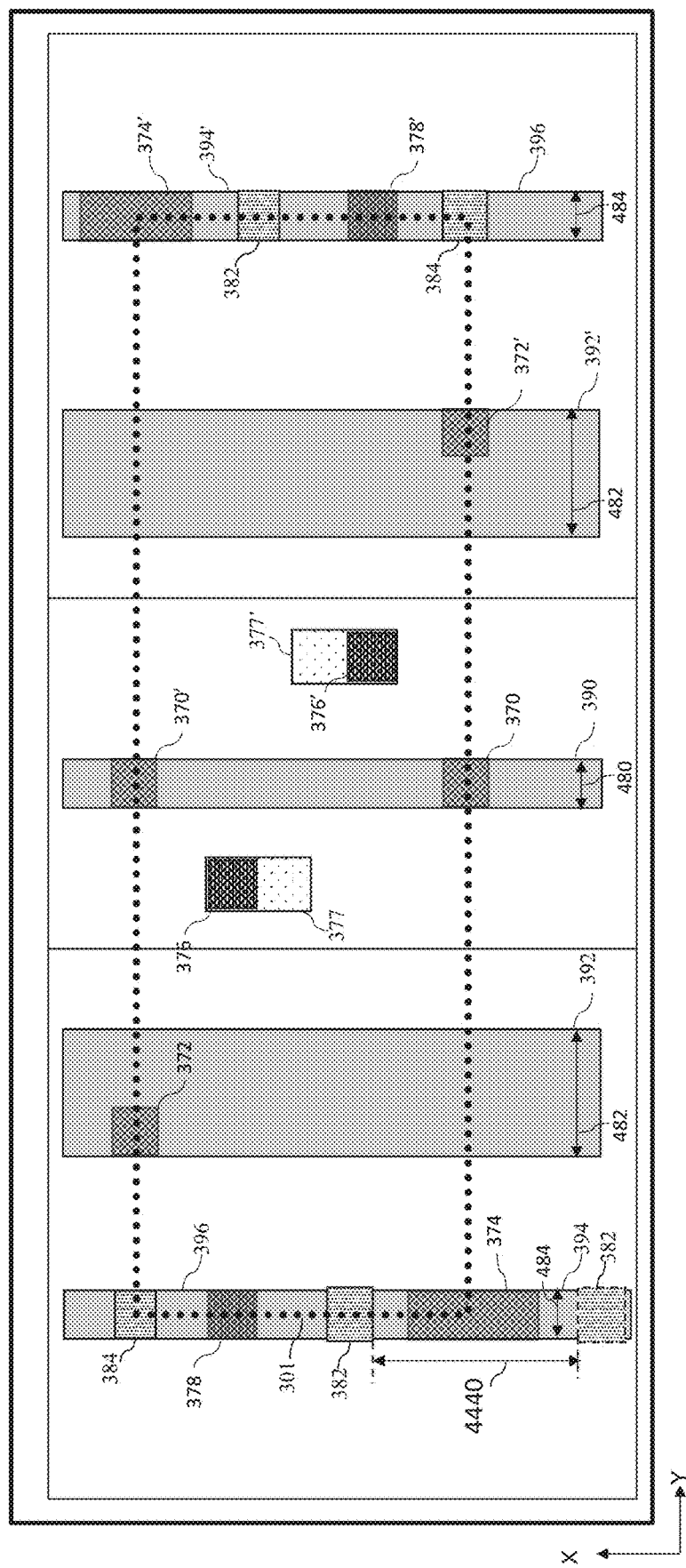
Figure 7:
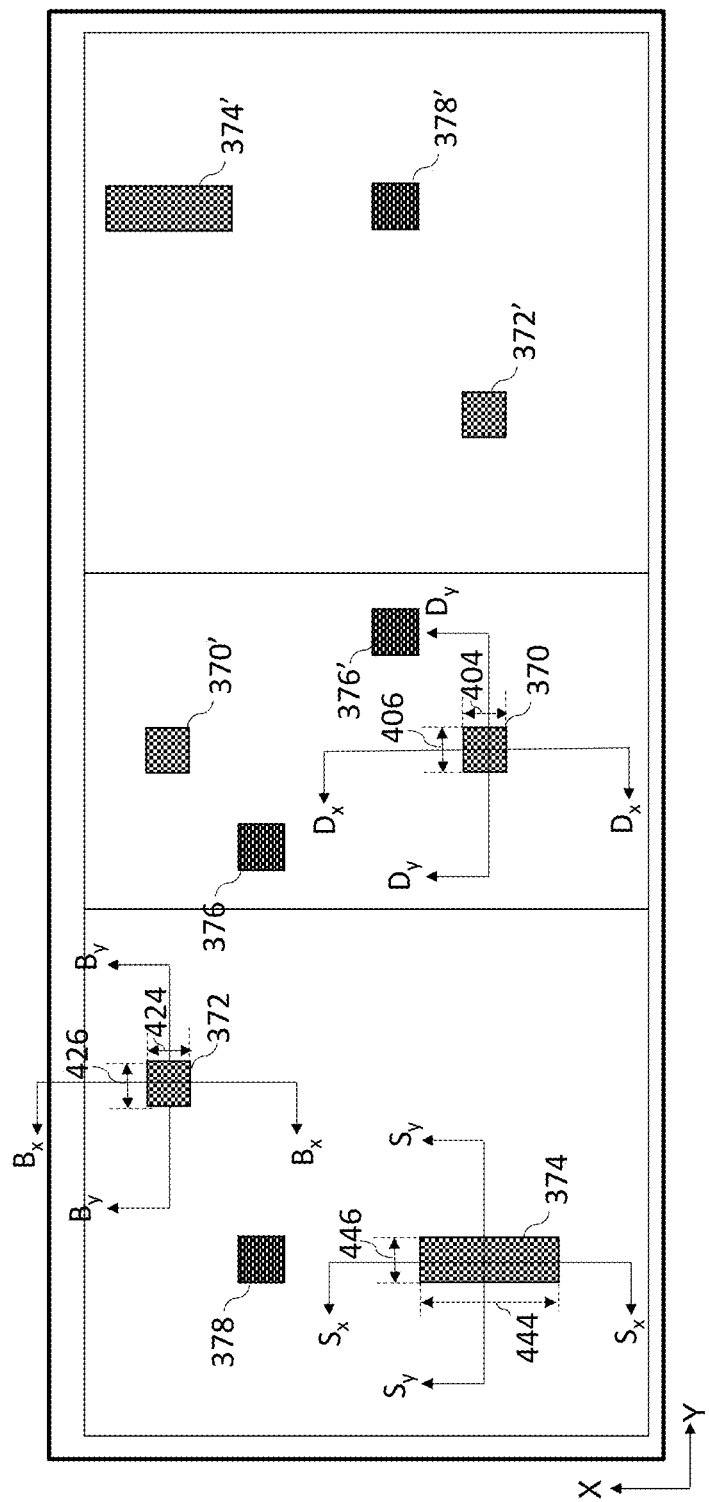

The structures of the memory cells 300 are described below in detail. FIG. 3 is a plan view of a memory cell 300, in portion or entirety, according to various aspects of the present disclosure. FIG. 4 is a three-dimensional (3D) perspective view of the memory cell 300, according to various aspects of the present disclosure. FIG. 5 illustrates a fragmentary cross-sectional view of the memory cell 300 along the A-A plane of FIG. 4. FIG. 6 illustrates a fragmentary cross-sectional view of the memory cell 300 along the B-B plane of FIG. 4. FIG. 7 illustrates a fragmentary cross-sectional view of the memory cell 300 along the C-C plane of FIG. 4.

Each memory cell 300 may be a single-port SRAM cell or a multi-port SRAM cell. Referring to FIG. 3, in the depicted embodiments, the memory cell 300 is a single-port SRAM cell, and includes six transistors: a pass-gate transistor PG-1, a pass-gate transistor PG-2, a pull-up transistor PU-1, a pull-up transistor PU-2, a pull-down transistor PD-1, and a pull-down transistor PD-1. The memory cell 300 is thus alternatively referred to as a 6T SRAM cell 300. In operation, pass-gate transistor PG-1 and pass-gate transistor PG-2 provide access to a storage portion of memory cell 300, which includes a cross-coupled pair of inverters. One of the inverters includes pull-up transistor PU-1 and pull-down transistor PD-1, and the other inverter includes pull-up transistor PU-2 and pull-down transistor PD-2. In some implementations, pull-up transistors PU-1, PU-2 are configured as p-type transistors, and pull-down transistors PD-1, PD-2, as well as pass-gate transistors PG-1, PG-2, are configured as n-type transistors. In the depicted embodiments, device features of the memory cell 300 are approximately symmetric around a center point of the memory cell 300. Accordingly, the description below focuses on features of transistors PG-1, PD-1, and PU-1. However, in other embodiments, device features of the memory cell 300 may have include other types of symmetry or may be asymmetric.

The features of the memory cell 300 are further illustrated in FIG. 4. Specifically, FIG. 4 illustrates the 3D perspective view of the memory cell 300. Still referring to FIG. 3 and further referring to FIG. 4, the memory cell 300 includes a substrate (wafer) 312. In the depicted embodiment, substrate 312 includes silicon. Alternatively or additionally, substrate 312 includes another elementary semiconductor, such as germanium; a compound semiconductor, such as silicon carbide, silicon phosphide, gallium arsenide, gallium phosphide, indium phosphide, indium arsenide, and/or indium antimonide; an alloy semiconductor, such as SiGe, SiPC, GaAsP, AlInAs, AlGaAs, GaInAs, GaInP, and/or GaInAsP; or combinations thereof. Alternatively, substrate 312 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

Substrate 312 includes various doped regions configured according to design requirements of memory cell 300. In the depicted embodiment, substrate 312 includes an n-type doped region 314 (also referred to as an n-well) and two p-type doped regions 316A and 316B (also referred to as p-wells). N-type doped region 314 is configured for a pMOS transistor, such as a pull-up (PU) transistor; and p-type doped regions 316A and 316B are each configured for an nMOS transistor, such as a pull-down (PD) transistor and a pass-gate (PG) transistor. N-type doped regions, such as n-type doped region 314, are doped with n-type dopants, such as phosphorus, arsenic, other n-type dopant, or combinations thereof. P-type doped regions, such as p-type doped region 316, are doped with p-type dopants, such as boron (for example, $BF_2$), indium, other p-type dopant, or combinations thereof. In some implementations, substrate 312 includes doped regions formed with a combination of p-type dopants and n-type dopants. The various doped regions can be formed directly on and/or in substrate 312, for example, providing a p-well structure, an n-well structure, a dual-well structure, a raised structure, or combinations thereof. An ion implantation process, a diffusion process, and/or other suitable doping process can be performed to form the various doped regions. In some implementations, n-type doped region 314 has an n-type dopant concentration of about $5 \times 10^{16}$ cm$^{-3}$ to about $5 \times 10^{19}$ cm$^{-3}$, and p-type doped regions 316A and 316B each has a p-type dopant concentration of about $5 \times 10^{16}$ cm$^{-3}$ to about $5 \times 10^{19}$ cm$^{-3}$.

As described above with respect to FIG. 3, memory cell 300 includes multiple transistors. For example, the memory cell 300 includes the pull-up transistor PU-1 and pull-up transistor PU-2 disposed over (and electrically connected to) n-well 314; pass-gate transistor PG-1 and pull-down transistor PD-1 disposed over (and electrically connected to) p-well 316A; and pass-gate transistor PG-2 and a pull-down transistor PD-2 disposed over (and electrically connected to) p-well 316B. PU-1 and PU-2 are configured as p-type transistors, while PD-1, PD-2, PG-1, and PG-2 are configured as n-type transistors (as described in more details below). Each transistor includes a fin structure disposed over the substrate 312. For example, pass-gate transistor PG-1 includes fin structure 320A and 320A'; pull-down transistor PD-1 includes the fin structures 320A and 320A'; pull-up transistor PU-1 includes a fin structure 320B; pull-up transistor PU-2 includes a fin structure 320C; pull-down transistor PD-2 includes fin structures 320D and 320D'; and pass-gate transistor PG-2 includes the fin structures 320D, 320D'. Fin structures 320A, 320A', 320D, and 320D' include p-type doped fins; and fin structures 320B and 320C include n-type doped fins. While the transistors are illustrated with certain number of fin structures, this disclosure contemplates each transistor to be independently single-fin transistors or multi-fin transistors in order to achieve certain design needs, for example, to achieve designed drive current. Each transistor also includes a gate structure. For example, pass-gate transistor PG-1 includes gate structure 350A disposed over fin structure 320A, 320A' (and between source/drain features); pull-down transistor PD-1 includes gate structure 350B disposed over fin structure 320A, 320A' (and between source/drain features); pull-up transistor PU-2 includes gate structure 350C disposed over fin structure 320C (and between source/drain features); pull-up transistor PU-1 includes gate structure 350D disposed over fin structure 320B (and between source/drain features); pull-down transistor PD-2 includes gate structure 350E disposed over fin structure 320D, 320D' (and between source/drain features); and pass-gate transistor PG-2 includes gate structure 350F disposed over fin structure 320D, 320D' (and between source/drain features). These fin structures and gate structures are described below.

Fin structures 320A, 320A', 320B, 320C, 320D, and 320D' each extend from the substrate 312 and orient substantially parallel to one another along the X-direction. The present disclosure contemplates variations in heights, widths, and/or lengths of fin structures that may arise from processing and fabrication of memory cell 300. In the depicted embodiment, fin structures 320A, 320A', 320B, 320C, 320D, and 320D' have substantially the same widths along their respective heights. However, in some embodiments, they may have tapered widths along their respective heights. Fin structures 320A, 320A', 320B, 320C, 320D, and 320D' may each have an average width along their respective height from about 5 nm to about 15 nm. In some implementations, fin width varies depending on a position of a base fin relative to other fin structures and/or relative to other features of memory cell 300. For example, widths of fin structures in the center of an array may be greater than widths of fin structures on the edge of the array. In another example, alternatively, widths of fin structures in the center of an array may be less than widths of fin structures on the edge of the array.

Fin structures 320A, 320A', 320B, 320C, 320D, and 320D' each have at least one channel region, at least one source region, and at least one drain region defined along their respective lengths in the x-direction, where a channel region is disposed between a source region and a drain region (generally and collectively referred to as source/drain regions). Each of the fin structures 320A, 320A', 320B, 320C, 320D, and 320D' has at least one source feature and at least one drain feature (collectively, source/drain features 326A-326D) in the source/drain region. The source/drain features 326A-326D are described in more detail later. The channel regions of the respective fin structures 320A, 320A', 320B, 320C, 320D, and 320D' each connect the respective pair of source/drain features 326A-326D, and each engages with a gate structure (as described in detail below), such that current can flow between the respective source/drain regions through the channel regions during operation. For example, a pair of source/drain features 326A are disposed over fin structures 320A and 320A' along the x-direction. The channel regions of the fin structures 320A, 320A' each engages with the gate structure 350B (as described below), such that current can flow between the source/drain regions 326A through the channel regions of the fin structures 320A, 320A' during the operation. Fin structures 320A, 320A', 320B, 320C, 320D, and 320D' are formed over substrate 312 using any suitable process. In some implementations, a combination of deposition, lithography and/or etching processes are performed to define fin structures 320A, 320A', 320B, 320C, 320D, and 320D'. In some embodiments, the fin structures 320A, 320A', 320B, 320C, 320D, and 320D' are formed from a portion of substrate 312, therefore having the same material as substrate 312, such as silicon (Si).

Isolation feature(s) 324 is formed over and/or in substrate 312 to isolate various regions, such as various device regions of memory cell 300. For example, isolation feature 324 separates and isolates fins from one another, such as fin structures 320A, 320A', 320B, 320C, 320D, and 320D'. Isolation feature 324 includes silicon oxide, silicon nitride, silicon oxynitride, other suitable isolation material (for example, including silicon, oxygen, nitrogen, carbon, or other suitable isolation constituent), or combinations thereof. Isolation feature 324 can include different structures, such as shallow trench isolation (STI) structures, deep trench isolation (DTI) structures, and/or local oxidation of silicon (LOCOS) structures. In some implementations, STI features can be formed by etching a trench in substrate 312 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation feature 324. In some implementations, STI features can be formed by depositing an insulator material over substrate 312 after forming fin structures 320A, 320A', 320B, 320C, 320D, and 320D', such that the insulator material layer fills gaps (trenches) between fin structures 320A, 320A', 320B, 320C, 320D, and 320D', and etching back the insulator material layer to form isolation feature 324. In some implementations, isolation feature 324 includes a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation feature 324 includes a dielectric layer disposed over a doped liner layer (including, for example, boron silicate glass (BSG) or phosphosilicate glass (PSG)).

As noted, gate structures 350A-350F are disposed over fin structures 320A, 320A', 320B, 320C, 320D, and 320D'. Gate structures 350A-350F each extend along the Y-direction (for example, substantially orthogonal to the lengthwise direction of fin structures). In the depicted embodiment, gate structure 350A is disposed over and engages a channel region of fin structures 320A, 320A' and interposes a pair of source/drain features 326A; and gate structure 350B is disposed over another channel region of fin structures 320A, 320A' and interposes another pair of source/drain features 326A. During operation, current flows between source/drain features 326A through the channel regions of the fin structures 320A, 320A'. In some embodiments, gate structures 350A and 350B are positioned such that at least one source/drain feature 326A (for example, a common drain feature or one of two coupled drain features) is disposed between gate structure 350A and gate structure 350B. In some implementations, gate structure 350A and a portion of fin structure 320A and/or 320A' form the pass-gate transistor PG-1; and gate structure 350B and a portion of fin structure 320A and/or 320A' form the pull-down transistor PD-1. Similarly, gate structures 350E and 350F are each disposed over and engage a channel region of fin structure 320D, 320D' and interpose a respective pair of source/drain features 326D. Current flows between source/drain regions of the fin structures 320D, 320D' during operation. In some embodiments, gate structures 350E and 350F are positioned such that at least one source/drain feature 326D (for example, a common drain feature or one of two coupled drain features) is disposed between gate structure 350E and gate structure 350F. In some implementations, gate structure 350E and a portion of fin structure 320D and/or 320D' form the pull-down transistor PD-2, and gate structure 350F and a portion of fin structure 320D and/or 320D' form the pass-gate transistor PG-2. Additionally, gate structure 350C is disposed over and engages a channel region of fin structure 320C, interposing a pair of source/drain features 326C. Current flows between source/drain features 320C during operation. In some implementations, gate structure 350C and a portion of fin structure 320C form the pull-up transistor PU-2. Furthermore, gate structure 350D is disposed over a channel region of fin structure 320B, interposing a pair of source/drain features 326B. Gate structure 350D engages the channel region of the fin structure 320B such that current can flow between source/drain features 326B during operation. In some implementations, gate structure 350D and a portion of fin structure 320B form the pull-up transistor PU-1.

Gate structures 350A-350F each include respective gate stacks configured to achieve desired functionality according to design requirements of memory cell 300, such that gate structures 350A-350F include the same or different layers and/or materials from one another. In the depicted embodiment, gate structures 350A-350F have gate stacks that include gate dielectrics 325A-325F, gate electrodes 330A-330F, and hard mask layers. Although not specifically depicted, gate structures 350A-350F may have different gate stacks formed in different doped regions, such as in n-type doped region 314 compared to in p-type doped regions 316A and 316B.

The gate stacks of gate structures 350A-350F are fabricated according to a gate last process, a gate first process, or a hybrid gate last/gate first process. In gate last process implementations, one or more of gate structures 350A-350F include dummy gate stacks that are subsequently replaced with metal gate stacks. The dummy gate stacks include, for example, an interfacial layer (including, for example, silicon oxide) and a dummy gate electrode layer (including, for example, polysilicon). In such implementations, the dummy gate electrode layer is removed to form openings (trenches) in which gate dielectric 325A-325F and/or gate electrode 330A-330F are subsequently formed. Gate last processes and/or gate first processes can implement deposition processes, lithography processes, etching processes, other suitable processes, or combinations thereof. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, e-beam writing, or ion-beam writing. The etching processes include dry etching processes, wet etching processes, other etching processes, or combinations thereof. A CMP process can be performed to remove any excess material of gate dielectrics 325A-325F, gate electrodes 330A-330F, and/or hard mask layers, planarizing gate structures 350A-350F.

Gate dielectrics 325A-325F are conformally disposed over the channel regions of the fin structures fin structures 320A, 320A', 320B, 320C, 320D, and 320D'and over isolation feature 324, such that gate dielectrics 325A-325F have a substantially uniform thickness. Gate dielectrics 325A-325F include a dielectric material, such as silicon oxide, high-k dielectric material, other suitable dielectric material, or combinations thereof. In the depicted embodiment, gate dielectrics 325A-325F include a high-k dielectric layer including, for example, hafnium, aluminum, zirconium, lanthanum, tantalum, titanium, yttrium, oxygen, nitrogen, other suitable constituent, or combinations thereof. In some implementations, the high-k dielectric layer includes $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. High-k dielectric material generally refers to dielectric materials having a high dielectric constant, for example, greater than that of silicon oxide (k≈3.9). In some implementations, gate dielectrics 325A-325F each further include an interfacial layer (including a dielectric material, such as silicon oxide) disposed between the high-k dielectric layer and the respective fin structures 320A, 320A', 320B, 320C, 320D, and 320D', and isolation feature 324.

Gate electrodes 330A-330F are disposed over gate dielectrics 325A-325F. Gate electrodes 330A-330F each include an electrically conductive material. In some implementations, gate electrodes 330A-330F each include multiple layers, such as one or more capping layers, work function layers, glue/barrier layers, and/or metal fill (or bulk) layers. A capping layer can include a material that prevents or eliminates diffusion and/or reaction of constituents between gate dielectrics 325A-325F and other layers of gate structures 350A-350F (in particular, gate layers including metal). In some implementation, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer can include a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu. In some embodiments, one or more of gate electrodes 330A, 330B, 330E, and 330F include an n-type work function metal with a work function of about 4.0 eV to about 4.6 eV. In some embodiments, one or both gate electrodes 330C and 330D include a p-type work function metal with a work function of about 4.5 eV to about 5 eV.

Gate structures 350A-350F further include respective gate spacers 340A-340F disposed adjacent to (for example, along sidewalls of) the respective gate stacks. Gate spacers 340A-340F are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 312 and subsequently anisotropically etched to form gate spacers 340A-340F. In some implementations, gate spacers 340A-340F include a multi-layer structure, such as a first dielectric layer that includes silicon nitride and a second dielectric layer that includes silicon oxide. In some implementations, gate spacers 340A-340F include more than one set of spacers, such as seal spacers, offset spacers, sacrificial spacers, dummy spacers, and/or main spacers, formed adjacent to the gate stacks. In such implementations, the various sets of spacers can include materials having different etch rates. For example, a first dielectric layer including silicon and oxygen can be deposited over substrate 312 and subsequently anisotropically etched to form a first spacer set adjacent to the gate stacks, and a second dielectric layer including silicon and nitrogen can be deposited over substrate 312 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features before and/or after forming gate spacers 340A-340F.

In some embodiments, gate structures 350A-350F are partially defined by dielectric features 380. The dielectric features 380 cut through the otherwise contiguous gate material layers and separate them into independent and distinct gate structures. For example, dielectric features 380 separates gate structure 350A from gate structure 350C, and separates gate structure 350D from gate structure 350F. The dielectric features 380 may include any suitable materials, such as silicon oxide, silicon nitride, oxynitride, a dielectric material having a dielectric constant (k) lower than thermal silicon oxide (therefore referred to as low-k dielectric material), and/or other suitable dielectric material layer. The dielectric feature 380 may be formed using any suitable methods. In some embodiments, a patterned hard mask is formed over the gate electrode layer. The patterned hard mask has an opening defining a line-cut (or gate-cut) at the location where the dielectric features 380 are to be formed later. The exposed portions of the gate electrode layer (along with gate spacers and other adjacent auxiliary layers) are removed through the opening to form a line-cut. The line-cut may extend to the isolation features 324 and divide the two portions of the gate electrode (and in some implementations, gate dielectric layers) into electrically isolated gate structures. The removal may implement a wet etch, a dry etch, and/or a combination thereof. Subsequently, the line-cut is filled with proper materials to form the dielectric feature 380, using deposition methods, for example, CVD, ALD, spin-on coating, or other suitable techniques. A CMP may be performed to polish back the dielectric features 380 thereby providing a substantially planar top surface with respect to the gate structures. In other words, the dielectric features 380 are formed on end-walls of the gate structures, and each have a top surface that extends in parallel to a top surface of the substrate 312 and along the top surfaces of the adjacent gate structures. The dielectric features 380 may interchangeably and alternatively be referred to as the gate-cut feature 380 an/or line-cut feature 380. In some embodiments, the dielectric feature 380 has a width dimension 488 along the Y-direction (see FIG. 15A).

Epitaxial source features and epitaxial drain features 326A-326D (referred to as epitaxial source/drain features 326A-326D) are disposed over the source/drain regions of fin structures 320A, 320A', 320B, 320C, 320D, and 320D'. For example, semiconductor material is epitaxially grown on fin structures 320A, 320A', 320B, 320C, 320D, and 320D', forming epitaxial source/drain features 326A-326D. In the depicted embodiment, a fin recess process (for example, an etch back process) is performed on source/drain regions of fin structures 320A, 320A', 320B, 320C, 320D, and 320D'. In such implementations, epitaxial source/drain features 326A-326D are grown from the top surface of recessed fin structures 320A, 320A', 320B, 320C, 320D, and 320D'. In furtherance of the depicted embodiment, epitaxial source/drain features 326A-326D each extend (grow) laterally (e.g., substantially perpendicular to the lengthwise direction of fin structures 320A-320D), such that epitaxial source/drain features 326A-326D have a greater lateral width than fin structures 320A, 320A', 320B, 320C, 320D, and 320D'. In the depicted embodiments, the lateral growth of the epitaxial features on top surface of the recessed fin structures 320A, 320A' merge with each other, such that the epitaxial source/drain feature 326A spans over both fin structures 320A and 320A'; and the lateral growth of the epitaxial features on top surface of the recessed fin structures 320D, 320D' merge with each other such that the epitaxial source/drain feature 326D spans over fin structures 320D and 320D'. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of fin structures. Epitaxial source/drain features 326A-326D are doped with n-type dopants and/or p-type dopants. For example, epitaxial source/drain features 326A and 326D (for n-type transistors PG-1, PD-1, PD-2, and PG-2) each include an n-type dopant and are formed from epitaxial layers including silicon and/or carbon, where silicon-containing epitaxial layers or silicon-carbon-containing epitaxial layers are doped with phosphorous, arsenic, other n-type dopant, or combinations thereof (for example, forming a Si:P epitaxial layer, a Si:C epitaxial layer, or a Si:C:P epitaxial layer). In furtherance of the example, the epitaxial source/drain features 326B and 326C (for p-type transistors PU-1 and PU-2) each include a p-type dopant and are formed from epitaxial layers including silicon and/or germanium, where the silicon germanium containing epitaxial layers are doped with boron, carbon, other p-type dopant, or combinations thereof (for example, forming a Si:Ge:B epitaxial layer or a Si:Ge:C epitaxial layer). In some implementations, epitaxial source/drain features 326A-326D include materials and/or dopants that achieve desired tensile stress and/or compressive stress in the channel region. In some implementations, epitaxial source/drain features 326A-326D are doped during deposition by adding impurities to a source material of the epitaxy process. In some implementations, epitaxial source/drain features 326A-3260D are doped by an ion implantation process subsequent to a deposition process. In some implementations, annealing processes are performed to activate dopants in epitaxial source/drain features 326A-326D and/or other source/drain regions, such as HDD regions and/or LDD regions. In some implementations, silicide layers are formed on epitaxial source/drain features 326A-326D. In some implementations, silicide layers are formed by depositing a metal layer over epitaxial source/drain features 326A-326D. The metal layer includes any material suitable for promoting silicide formation, such as nickel, platinum, palladium, vanadium, titanium, cobalt, tantalum, ytterbium, zirconium, other suitable metal, or combinations thereof. Memory cell 300 is then heated (for example, subjected to an annealing process) to cause constituents of epitaxial source/drain features 326A-326D (for example, silicon and/or germanium) to react with the metal. The silicide layers thus include metal and a constituent of epitaxial source/drain features 326A-326D (for example, silicon and/or germanium). In some implementations, the silicide layers include nickel silicide, titanium silicide, or cobalt silicide. Any un-reacted metal, such as remaining portions of the metal layer, is selectively removed by any suitable process, such as an etching process. In some implementations, the silicide layers and epitaxial source/drain features 326A-326D are collectively referred to as the epitaxial source/drain features of transistors of memory cell 300.

A multilayer interconnect (MLI) feature 356 is disposed over the substrate 312. MLI feature 356 electrically couples various devices (for example, p-type transistors PU-1 and PU-2, n-type transistors PG-1, PD-1, PD-2, and PG-2, other transistors, resistors, capacitors, and/or inductors) and/or components (for example, gate structures (for example, gate structures 350A-350F) and/or source/drain features (for example, epitaxial source/drain features 326A-326D)) of memory cell 300, such that the various devices and/or components can operate as specified by design requirements of memory cell 300. MLI feature 356 includes a combination of dielectric layers and electrically conductive layers (for example, metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of MLI feature 356. During operation of memory cell 300, the interconnect features are configured to route signals between the devices and/or the components of memory cell 300 and/or distribute signals (for example, clock signals, voltage signals, and/or ground signals) to the devices and/or the components of memory cell 300. MLI feature 356 is only partially illustrated in FIG. 4. For example, only metal lines but not dielectric features (such as interlayer dielectric layers) are illustrated in FIG. 4.

It is further noted that though MLI feature 356 is depicted with a given number of dielectric layers and conductive layers, the present disclosure contemplates MLI feature 356 having more or fewer dielectric layers and/or conductive layers. The components of the MLI feature 356 are further illustrated in FIGS. 5-14B.

Figures 10, 11:
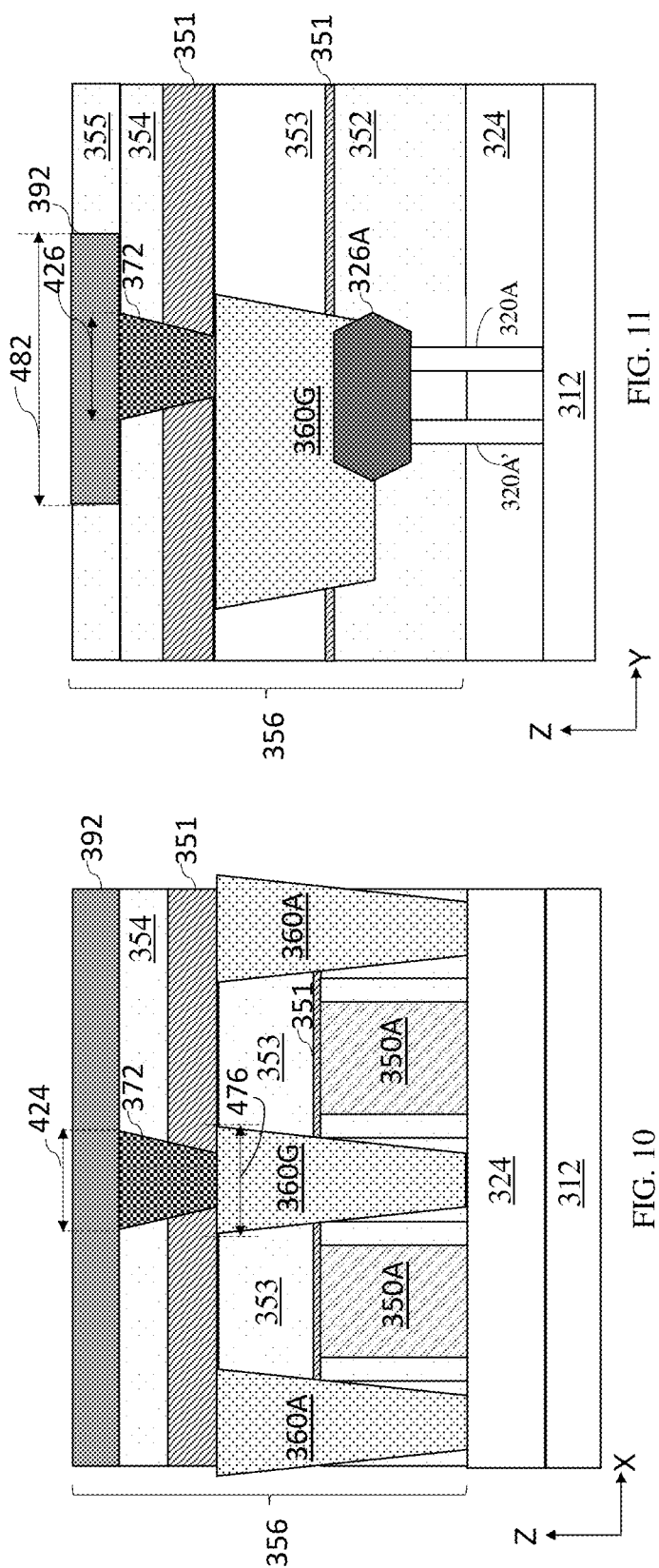

FIG. 5 illustrates the device layer (e.g., the layer including the transistors PD-1, PU-1, PG-1, PD-2, PU-2, and PG-2), such as the cross-section marked by the A-A line in FIG. 4. FIG. 6 illustrates the first metal layer (e.g. the M0 layer, including, for example, the source supply voltage ($V_{SS}$) lines, the drain supply voltage ($V_{DD}$) line, and the bit lines), such as the cross-section marked by the B-B line in FIG. 4. FIG. 7 illustrates the plane that cuts across the via features (such as gate vias (VG) 376, 376', 378, 378', and source/drain vias (VD) 370, 372, 374, 370', 372', and 374') between the first metal layer and the device layer, such as the cross-section marked by the C-C line in FIG. 4. It is noted that, in addition to showing features on the respective cross-sections, FIGS. 5 and 6 further include projections of the via features (such as VG and VD), along the Z-direction, on the respective cross-sections. This is solely for the ease of description (such as to clearly indicate the positions of the various features on the cross-sections in relation to the via features). It does not suggest physical presence of those via features on the cross-sections. Moreover, FIG. 8 illustrates a cross-sectional view of the device features, along an X-Z plane (such as the X-Z plane marked by the $D_x$-$D_x$ line of FIG. 7) around the via feature 370; FIG. 9 illustrates a cross-sectional view of the device features, along a Y-Z plane (such as the Y-Z plane marked by the $D_y$-$D_y$ line of FIG. 7) around the via feature 370; FIG. 10 illustrates a cross-sectional view of the device features, along an X-Z plane (such as the X-Z plane marked by the $B_x$-$B_x$ line of FIG. 7) around the via feature 372; FIG. 11 illustrates a cross-sectional view of the device features, along a Y-Z plane (such as the Y-Z plane marked by the $B_y$-$B_y$ line of FIG. 7) around the via feature 372; FIG. 12 illustrates a cross-sectional view of the device features, along an X-Z plane (such as the X-Z plane marked by the $S_x$-$S_x$ line of FIG. 7) around the via feature 374; FIG. 13 illustrates a cross-sectional view of the device features, along a Y-Z plane (such as the Y-Z plane marked by the $S_y$-$S_y$ line of FIG. 7) around the via feature 374. FIGS. 5-13 have been abbreviated for simplicity and clarity.

As illustrated in FIGS. 8-13, MLI feature 356 includes one or more dielectric layers, such as an interlayer dielectric layer 352 (ILD-0) disposed over substrate 312, an interlayer dielectric layer 353 (ILD-1) disposed over ILD layer 352, an ILD layer 354 (ILD-2) disposed over ILD layer 353, an intermetal dielectric layer (IMD) 355, as well as additional ILD layers (not shown) disposed over IMD layer 355. It is noted that the IMD layer 355 is also interchangeably referred to as the ILD layer 355 for simplicity. ILD layers 352-355 include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SILK® (Dow Chemical, Midland, Michigan), polyimide, other low-k dielectric material, or combinations thereof. In the depicted embodiment, ILD layers 352-355 are dielectric layers that include a low-k dielectric material (generally referred to as low-k dielectric layers). In some implementations, low-k dielectric material generally refers to materials having a dielectric constant (k) that is less than 3. (Original) ILD layers 352-355 can include a multilayer structure having multiple dielectric materials. MLI feature 356 can further include one or more contact etch stop layers (CESLs) disposed between ILD layers, such as a CESL 351 disposed between ILD layer 352 and ILD layer 353, a CESL 351 disposed between ILD layer 353 and ILD layer 354, etc. In some implementations, a CESL is disposed between substrate 312 and/or isolation feature 324 and ILD layer 352. CESLs include a material different than ILD layers 352-355. For example, where ILD layers 352-354 include a low-k dielectric material, CESLs include silicon and nitrogen, such as silicon nitride or silicon oxynitride. ILD layers 352-355 are formed over substrate 312 by a deposition process, such as CVD, PVD, ALD, HDPCVD, MOCVD, RPCVD, PECVD, LPCVD, ALCVD, APCVD, plating, other suitable methods, or combinations thereof. In some implementations, ILD layers 352-355 are formed by a flowable CVD (FCVD) process that includes, for example, depositing a flowable material (such as a liquid compound) over substrate 312 and converting the flowable material to a solid material by a suitable technique, such as thermal annealing and/or ultraviolet radiation treating. Subsequent to the deposition of ILD layers 352-355, a CMP process and/or other planarization process is performed, such that ILD layers 352-355 have substantially planar surfaces.

Device-level contacts 360A-360H are disposed in ILD layers 353 to form a part of MLI feature 356. Device-level contacts 360A-360H include any suitable electrically conductive material, such as Ta, Ti, Al, Cu, Co, W, TiN, TaN, other suitable conductive materials, or combinations thereof. Various conductive materials can be combined to provide device-level contacts 360A-360H with various layers, such as a barrier layer, an adhesion layer, a liner layer, a bulk layer, other suitable layer, or combinations thereof. In some implementations, device-level-contacts 360A-360H include Ti, TiN, and/or Co, and are formed by patterning ILD layer 353 and/or ILD layer 352. Patterning ILD layers 353 and/or 352 can include lithography processes and/or etching processes to form openings (trenches), such as contact openings, in ILD layers 353 and/or 352. In some implementations, the lithography processes include forming a resist layer over ILD layer 353, exposing the resist layer to patterned radiation, and developing the exposed resist layer, thereby forming a patterned resist layer that can be used as a masking element for etching opening(s) in ILD layers 353 and/or 352. The etching processes include dry etching processes, wet etching processes, other etching processes, or combinations thereof. Thereafter, the opening(s) are filled with one or more conductive materials. The conductive material(s) can be deposited by PVD, CVD, ALD, electroplating, electroless plating, other suitable deposition process, or combinations thereof. Thereafter, any excess conductive material(s) can be removed by a planarization process, such as a CMP process, thereby planarizing a top surface of ILD layer 353 and a top surface of device-level contacts 360A-360H. In some embodiments, as depicted in FIG. 5, the device-level contacts 360C and 360D each has a dimension 474 along the X-direction; the device-level contacts 360E and 360F each has a dimension 472 along the X-direction; and the device-level contacts 360G and 360H each has a dimension 476 along the X-direction.

Device-level contacts 360A-360H (also referred to as local interconnects or local contacts) electrically couple and/or physically couple IC device features, such as features of p-type transistors PU-1 and PU-2, and n-type transistors PG-1, PD-1, PD-2, and PG-2, to other components of MLI feature 356, for example, vias of the MLI feature (not shown). For example, device-level contacts 360A-360H are metal-to-device (MD) contacts, which generally refer to contacts to a conductive region, such as source/drain regions, of memory cell 300. Device-level contacts 360A-360H extend through ILD layer 353, though the present disclosure contemplates embodiments where device-level contacts 360A-360H extend through more ILD layers and/or CESLs of MLI feature 356. For example, as illustrated in FIGS. 9 and 11, the device-level contacts 360A-360H may further extends downward into the ILD layer 352.

MLI feature 356 further includes via structures (also interchangeably referred to as vias or via features) formed on device-level contacts 360A-360H. For example, vias 370 and 370' are formed on device-level contacts 360C and 360D, respectively. The vias 370 and 370' each connects the device features (such as source/drain features 326B and 326C, respectively) with conductive line 390. Moreover, vias 372 and 372' are formed on device-level contacts 360G and 360H, respectively. The vias 372 and 372' connect the device features (such as source/drain features 326A and 326D, respectively) with bit lines 392 and 392', respectively. Furthermore, vias 374 and 374' are formed on device-level contacts 360E and 360F, respectively. The vias 374 and 374' connect the device features (such as source/drain features 326A and 326D, respectively) with conductive lines 394 and 394', respectively. Still further, the MLI feature 356 includes via features 376, 376', 378 and 378' to complete the circuit and to facilitate the device operations.

The via features may be formed by any suitable methods. In some embodiments, via openings are formed in ILD layer 354 (and, in some implementations, in CESL 351) by a patterning process. The patterning process includes lithography processes and/or etching processes. For example, forming via openings includes performing a lithography process to form a patterned resist layer over ILD layer 354 and performing an etching process to transfer a pattern defined in the patterned resist layer to ILD layer 354. The lithography process can include forming a resist layer on ILD layer 354 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of ILD layer 354. The etching process can include a dry etching process (for example, a reactive ion etching (RIE) process), a wet etching process, other suitable etching process, or combinations thereof. After the etching process, the patterned resist layer is removed from ILD layer 354, for example, by a resist stripping process. In some implementations, the patterned resist layer is used as an etch mask to remove portions of CESL 351 and/or capping layers to extend the via openings, thereby exposing the underlying device-level contacts 360A-360H. Various selective etching processes can be performed. Alternatively, the exposure process can be implemented or replaced by other methods, such as maskless lithography, electron-beam (e-beam) writing, ion-beam writing, and/or nanoimprint technology.

Subsequently, vias 372-376 and 372'-376' are formed in the via openings. The vias 372-376 and 372'-376' may include any suitable via materials, such as cobalt (Co), ruthenium (Ru), copper (Cu), tantalum (Ta), titanium (Ti), iridium (Ir), tungsten (W), aluminum (Al), tantalum nitride (TaN), titanium nitride (TiN), other suitable metals, or combinations thereof. Although not depicted, the vias may include multiple layers, such as via barrier layers, via seed layers, and/or via bulk layers. The layers for the vias 370-378 and 370'-378' may be formed by any suitable methods, such as ALD, CVD, PVD, electroplating, electroless plating, other suitable deposition process, or combinations thereof. In some embodiments, various layers of the vias 370-378 and 370'-378' may be conformal. Moreover, in some embodiments, a CMP process and/or other planarization process is performed to form a planarized top surface.

MLI feature 356 further includes conductive lines 390, 392, 392', 394, and 394', each extending along the X-direction. Conductive line 390 is disposed over via 370 and 370'; conductive lines 392 and 392' are disposed over via features 372 and 372', respectively; conductive lines 394 and 394' are disposed over via features 374 and 374', respectively. Moreover, conductive lines 394 and 394' are disposed over via features 378 and 378', respectively. Furthermore, conductive line 392 is connected to the via 376 through contact 377; and conductive line 392' is connected to the via 376' through contact 377'. The conductive lines 390, 392, 392', 394, and 394' may include any suitable conductive materials, and may include the same or different materials from one another. For example, the conductive lines 390, 392, 392', 394, and 394' may include copper, copper alloy, tantalum, tantalum nitride, titanium, titanium nitride, aluminum, tungsten, polysilicon, cobalt, other suitable conductive materials, or combinations thereof. The conductive lines 390, 392, 392', 394, and 394' may be formed by any suitable methods. In some embodiments, the conductive lines 390, 392, 392', 394, and 394' are formed in the same metal layer, such as the first metal layer MO. In some embodiments, the conductive lines have different line widths. For example, the conductive lines 394 and 394' each has line width 484; the conductive lines 390 and 390' each has line width 480; and the conductive lines 392 and 392' each has line width 482. In some embodiments, line width 482 is greater than the line widths 484 and 480. Moreover, referring to FIG. 6, the conductive lines 390, 392, 392', 394, and 394' have different line lengths along the X-direction. For example, the conductive lines 394 and 394' each have line lengths 4440 defined by adjacent dielectric features 382 and 382', such as between a sidewall 542 of the dielectric feature 382 of the memory cell 300 and a sidewall 544 of the dielectric feature 382 of an adjacent memory cell 300. As illustrated in FIG. 6, a distance between the two dielectric features 382 and 382' define the length 4440 of the conductive line 394. Similarly, although not specifically depicted, conductive line 394' similarly has the length 4440 defined by the dielectric features 382 and 382'. The dielectric features 382 are substantially similar to the dielectric features 380 described above and may be fabricated using substantially similar methods. In some embodiments, as illustrated in FIG. 4, additional conductive lines are formed over the conductive lines 390, 392, 392', 394, and 394', for example, along a direction perpendicular to the conductive lines 390, 392, 392', 394, and 394'. These additional conductive lines form the second metal layer M1.

In some embodiments, the device-level contacts 360A-360H and/or the via features 370-378, 370'-378' may have tapered profiles along their respective height along the Z-direction. Referring to FIGS. 8-13, the device-level contacts 360A-360H and/or the via features 372-376, 372'-376' may have top surfaces that are wider than their respective bottom surfaces. However, this present disclosure contemplates any suitable profile for the device-level contacts 360A-360H and/or the via features 370-378, 370'-378'. The present disclosure further contemplates different configurations of device-level contacts, vias, and/or conductive lines, depending on design requirements of memory cell 300.

A drain region of pull-down transistor PD-1 (formed by n-type epitaxial source/drain features 326A) and a drain region of pull-up transistor PU-1 (formed by p-type epitaxial source/drain features 326B) are electrically connected by device-level contact 360A, such that a common drain of pull-down transistor PD-1 and pull-up transistor PU-1 form a storage node, which is further electrically connected to a drain region of pass-gate transistor PG-1 (formed by n-type epitaxial source/drain features 326A) by device-level contact 360A. A drain region of pull-down transistor PD-2 (formed by n-type epitaxial source/drain features 326D) and a drain region of pull-up transistor PU-2 (formed by p-type epitaxial source/drain features 326C) are electrically connected by device-level contact 360B, such that a common drain of pull-down transistor PD-2 and pull-up transistor PU-2 form another storage node, which is further electrically connected to a drain region of pass-gate transistor PG-2 (formed by n-type epitaxial source/drain features 326D) by device-level contact 360B. A source region of pull-up transistor PU-1 (formed by p-type epitaxial source/drain features 326B) is electrically connected to a drain supply voltage VDD by device-level contact 360C, via feature 370, and conductive line 390; and a source region of pull-up transistor PU-2 (formed by p-type epitaxial source/drain features 326C) is electrically connected to drain supply voltage VDD by device-level contact 360D, via feature 370' and the conductive line 390. A source region of pull-down transistor PD-1 (formed by n-type epitaxial source/drain features 326A) is electrically connected to a source supply voltage Vss by device-level contact 360E, via feature 374, and conductive line 394; and a source region of pull-down transistor PD-2 (formed by n-type epitaxial source/drain features 326D) is electrically connected to source supply voltage Vss by device-level contact 360F, via feature 374', and conductive line 394'. A source region of pass-gate transistor PG-1 (formed by n-type epitaxial source/drain features 326A) is electrically connected to a bit line 392 by device-level contact 360G and via feature 372; and a source region of pass-gate transistor PG-2 (formed by n-type epitaxial source/drain features 326D) is electrically connected to another bit line 392' by device-level contact 360H and via feature 372'. The gates of pass-gate transistors PG-1, PG-2 are electrically coupled with a word line. In some implementations, pass-gate transistors PG-1, PG-2 provide access to storage nodes during read operations and/or write operations. For example, pass-gate transistors PG-1, PG-2 couple storage nodes to the respective bit lines in response to voltage applied to the gates of pass-gate transistors PG-1, PG-2 by word lines.

Referring now to FIG. 7, in some embodiments, the vias 370, 370' have a dimension 404 along the X-direction, and a dimension 406 along the Y-direction; the vias 372, 372' have a dimension 424 along the X-direction, and a dimension 426 along the Y-direction; the vias 374, 374' have a dimension 444 along the X-direction, and a dimension 446 along the Y-direction. In some embodiments, it may be desirable to design the dimensions of the via features along the X-direction to be less than the dimension of the underlaying device-level contacts. As described above, in forming the via features, an etching process opens up a portion of the ILD layer 354 above the device-level contacts. If the dimensions of the via features along the X-direction (which determines the dimensions of the openings) is greater than the dimension of the underlaying device-level contacts, the etching process may cause a portion of the opening (such as the portion that is beyond the top surface of the device-level contact) to extend pass the sidewall of the device-level contact and into the ILD layer 353. In some embodiments, the opening may further extend through the CESL 351 to reach the gate structures adjacent to the device-level contacts. Subsequently formed via features, therefore, are formed partially on the gate structures, thereby causing leakage. Additionally, in some embodiments, the via features are designed to have dimensions along the Y-direction that is about the same or less than the dimension of the overlaying conductive lines, so as not to unnecessarily occupy valuable chip space.

Figure 14B:
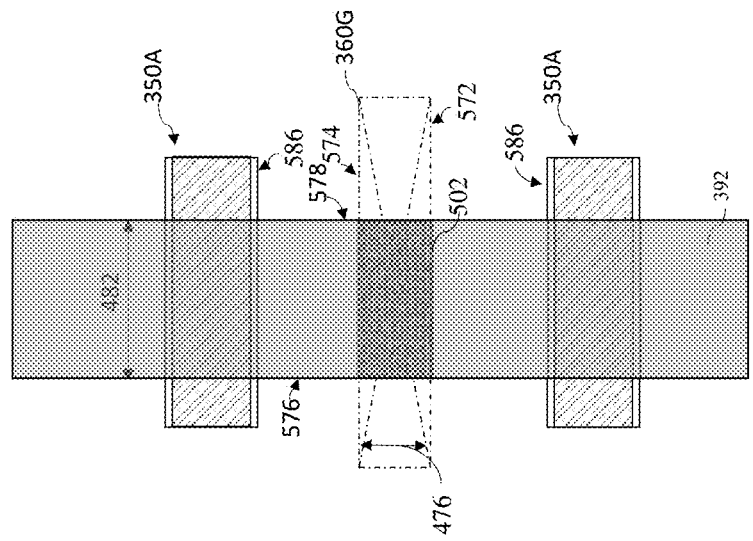
Figure 14A:
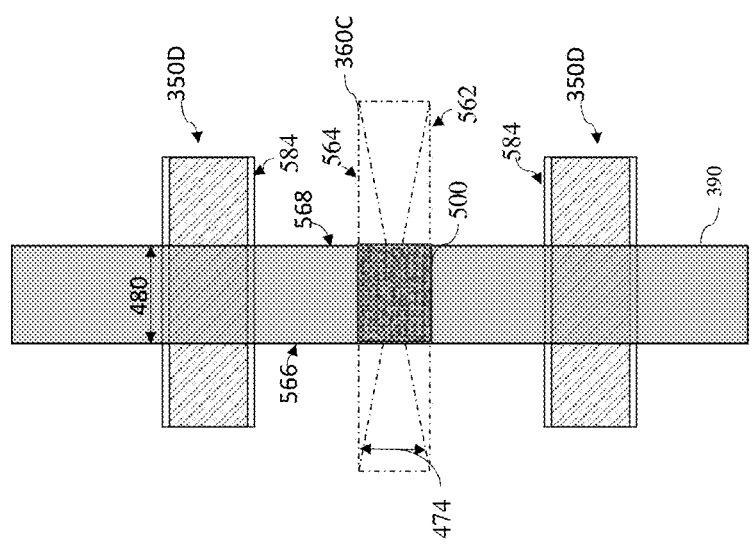

FIGS. 14A and 14B illustrate the features on both ends of the via features 370 and 372, respectively, without showing the via features themselves for clarity. Referring to FIG. 14A and FIGS. 7, 8, and 9, the dimensions 406 of the via feature 370 along the Y-direction is designed to be the same as or less than the smaller dimension of the conductive line 390 overlaying the via feature 370 and the dimension of the device-level contacts 360C underlaying the via feature 370. In other words, the dimension 406 is designed to be less than or the same as the dimension 480. Similarly, the dimension 404 of the via feature 370 along the X-direction is designed to be the same as or less than the smaller dimension of the conductive line 390 overlaying the via feature 370 and the dimension of the device-level contacts 360C underlaying the via feature 370. In other words, the dimension 404 is designed to be less than or the same as the dimension 474. Accordingly, the via feature 370 is confined within the boundary planes defined by the sidewalls 562 and 564 of the device-level contact 360C, as well as those defined by the sidewalls 566 and 568 of the conductive line 390, such that the via feature 370 is confined with the region 500. In the depicted embodiments, the region 500 may be described as an overlapped region between the top surface of the device-level contacts 360C with a projection along the Z-direction of the bottom surface of the overlaying conductive line 390 onto the top surface of the device-level contacts 360C. Moreover, referring to FIG. 14B and FIGS. 7, 10, and 11, the dimensions 426 and 424 of the via features 372 are designed to each be less than or the same as the dimension 482 of the overlaying conductive line 392 and the dimension 476 of the underlaying device-level contact 360G, respectively. Accordingly, the via feature 372 is confined within the boundary planes defined by the sidewalls 572 and 574 of the device-level contact 360G, as well as those defined by the sidewalls 576 and 578 of conductive line 392, such that the via feature 372 is confined with the region 502. In the depicted embodiments, the region 502 may be described as an overlapped region between the top surface of the device-level contacts 360G with a projection along the Z-direction of the bottom surface of the overlaying conductive line 392 onto the top surface of the device-level contacts 360G. If the via features 370 extends beyond the region 500, such as when the dimension 404 is greater than the dimension 474; or if the via features 372 extends beyond the region 502, such as when the dimension 424 is greater than the dimension 476, the etching process forming openings for the via features 370, 372 may extend onto top surfaces of the gate structures 350D, 350A, respectively. Accordingly, the via features 370 and 372 formed therein will bridge with the gate structures.

In some embodiments, a ratio of the dimension 406 to the dimension 480 may be about 0.8 to 1:1; a ratio of the dimension 404 to the dimension 474 may be about 0.8 to 1:1; a ratio of the dimension 426 to the dimension 482 may be about 0.8 to 1:1; a ratio of the dimension 424 to the dimension 476 may be about 0.8 to 1:1. If one or more of these ratios are too small, such as less than 0.8, the via feature may not have the maximal dimension and thereby not having the lowest resistance necessary to optimize device performance. If the ratios are too large, such as greater than 1:1, any improvement in the resistance may be offset by the risk of shorting with adjacent gate structures thereby causing function failure.

Figure 15A:
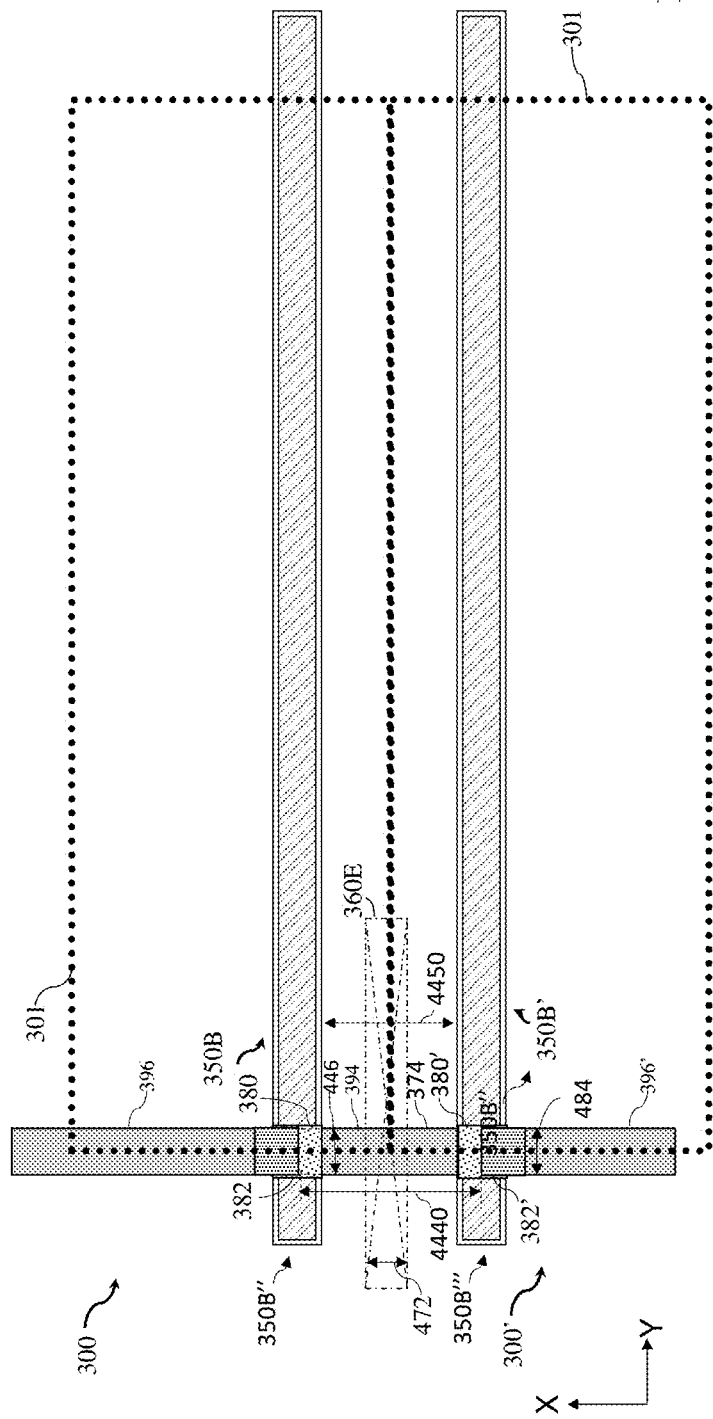

FIGS. 15A and 15B illustrate the design of the via feature 374 and its surrounding features of memory cell 300, such as gate structures 350B, dielectric feature 380, conductive line 394, and dielectric feature 382. FIGS. 15A and 15B further include some of the relevant features from neighboring memory cells 300', such as gate structures 350B'. The neighboring memory cell 300' includes features that may be a mirror image to those of the memory cell 300. For example, the memory cell 300' includes another gate structure 350B', another dielectric feature 380', and another dielectric feature 382'. The gate structure 350B' may be identical to the gate structure 350B; the dielectric feature 380' may be identical to the dielectric feature 380; and the dielectric feature 382' may be identical to the dielectric feature 382. In the depicted embodiments, the dielectric features 380 and 380' are separated by a distance 4450 along the X-direction; and the dielectric features 382 and 382' are separated by a distance 4440 along the X-direction. Moreover, the conductive line 394 extends across the boundary 301 between the memory cell 300 and the memory cell 300'.

In some approaches, the via feature 374 is designed in a way similar to the via features 372 and 370. In other words, referring to FIGS. 15A, 15B, and FIGS. 7, 12, and 13, the dimensions 446 and 444 of the via features 374 may each be less than or the same as the dimension 484 of the overlaying conductive line 394 and the dimension 472 of the underlaying device-level contact 360E, respectively. Accordingly, the via feature 374 is confined within the boundary planes defined by the sidewalls 552 and 554 of the device-level contact 360E, as well as those defined by the sidewalls 556 and 558 of conductive line 394, such that the via feature 374 is confined with the region 504. In the depicted embodiments, the region 504 may be described as an overlapped region between the top surface of the device-level contacts 360E with a projection along the Z-direction of the bottom surface of the overlaying conductive line 394 onto the top surface of the device-level contacts 360E. Unlike via features 372 and 370, however, the via feature 374 is situated on a charge carrier pathway that largely determines the operation speeds of the memory cell. Specifically, the via feature 374 electronically connects a source feature of an nMOS to a source supply voltage ($V_{SS}$). Resistances on the source side and the supply side may have a larger impact on the device performances than resistances elsewhere. For example, power coming from the source side and/or the supply side may be designed to feed into two or more drain features or components, such that a higher voltage level and/or a higher current level may be desirable. Accordingly, high resistance in the via feature 374 due to size confinement asserts substantially greater adverse impact to the performance of the memory cell 300.

In some approaches (not shown), the overlaying conductive lines 394 may extend along the X-direction but offset from the dielectric features 380 along the Y-direction; and/or the overlaying conductive lines 394 may have a width dimension 484 that is greater than the width dimension 488 of the dielectric features 380. In some embodiments, the dielectric features 380 directly interfaces with gate structures on two sidewalls (such as along Y-Z planes). Accordingly, at least a portion of the overlaying conductive line 394 is vertically over a respective gate structure along the Z-direction. In such approaches, forming the via feature 374 that extends beyond the region 504 may cause similar issues as those described above with respect to via features 370 and 372. In other words, bridging between the via feature 374 and the gate structure therebeneath may cause leakages. According to some embodiments of the present disclosure, the conductive line 394 is formed over a portion of the dielectric features 380. Moreover, the dimension 488 of the dielectric feature 380 is greater than the dimension 484 of the conductive line 394. Furthermore, the entirety of the conductive line 394, as well as the sidewall surfaces 556 and 558 of the conductive line 394 each extend between the sidewall surfaces 566 and 568 of the dielectric feature 380. As a result, a vertical projection of the conductive line 394 along the Z-direction do not land on the gate structures 350B or any other gate structures (such as adjacent gate structures 350B', 350B'', and 350B''' of adjacent memory cells 300). For example, a vertical projection of a bottom surface of the conductive line 394 onto a plane that extends along the top surface of the dielectric feature 380 land either on the dielectric features 380, the isolation structure 352, or on the device-level contact 360E. In other words, the width dimension (e.g. along the Y-direction) of the vertical projection fits entirely within the width dimension of the dielectric features 380.

The via feature 374 is formed below and interfacing directly with the conductive line 394. Accordingly, having the conductive line 394 extending over the dielectric features 380 and not the gate structures allows the via feature 374 immediately below it to also avoid contacting with the gate structures, as long as the via feature 374 stays within the vertical projection of the conductive line 394. In such a design, the dimension 444 of the via feature 374 may increase beyond the dimension 472 of the underlaying device-level contact 360E without the concern to bridge with the adjacent gate structures. As described above, the increase in the size of the via features 374 reduces the resistance and improves the device performance. In some embodiments, the dimension 444 is greater than the dimension 472 of the device-level contact 360E. For example, a ratio of the dimension 444 to the dimension 472 is at least 1.1:1, for example about 1.2:1 to about 3:1. If the dimension 444 is too small, such as less than about 10% greater than the dimension 472, the improvement in reduction of resistance within the via feature 374 (and the consequent performance gain) may be too small to justify the extra cost for fabricating cost. Meanwhile, the dimension 444 of the via feature 374 may be less than the length dimension 4440 of the conductive line 394 (which is also the separation between the adjacent dielectric features 382 and 382'). If the dimension 444 is greater than the length dimension 4440, the via feature 374 may be too close to neighboring conductive lines, such as conductive lines 396, such that inadvertent misalignment may lead to shorting. Accordingly, the via feature 374 may have a size that is confined to the region 512. Referring to FIG. 15B, the region 512 may be defined by the sidewalls 556 and 558 of the conductive line 394, and the sidewalls 542 and 544 of the conductive line 394 (which are also sidewalls of the dielectric feature 382). In other words, the size and profile of the via feature 374 may be confined by the size and profile of the overlaying conductive line 394. In other words, a maximum size of the via feature 374 matches the size of the conductive line 394. The region 512 is substantially greater in surface area than the regions 500, 502, and 504.

In some embodiments, a ratio of the dimension 446 to the dimension 484 is about 0.8:1 to about 1:1. Furthermore, the dimension 444 of via feature 374 is substantially greater than the dimension 446 of via feature 374. For example, an aspect ratio of the via feature 374 is about 1.2:1 to about 3:1. Here, the term aspect ratio is defined as the length dimension (along the X-direction) of a feature to the width dimension (along the Y-direction). In other words, a ratio of the dimension 444 to the dimension 446 is about 1.2:1 to about 3:1. If the aspect ratio is too small, such as less than about 1.2:1, the dimension 444 may be too small to have minimal resistance thereby not reaching the best performance; while if the aspect ratio is too large, the dimension 446 may be too small to have the minimal resistance thereby also fail to reach the best performance. Conversely, the aspect ratio of the via feature 370 may be about 0.8:1 to about 1.2:1; and the aspect ratio of the via feature 372 may be about 0.8:1 to about 1.2:1. Therefore, the top surface of the via feature 374 more resembles a rectangle than a square.

FIGS. 16A, 16B, and 16C illustrate example via feature 374 in relation to the adjacent features. FIGS. 16A, 16B, and 16C generally resembles the FIG. 15B with the exception that projection of the via feature 374 is also illustrated. Referring to FIG. 16A, the via feature 374 has a dimension 446 that matches the dimension 484 of the conductive line 492. For example, referring to FIG. 16A, the via feature 374 have a dimension 444 that is greater than the dimension 472 of the device-level contact 360E, but less than the dimension 4440 of the conductive line 394. Moreover, the dimension 444 is less than the distance 4450 between gate structures 350B and 350B'. Referring to FIG. 16B, the dimension 444 of the via feature 374 is also greater than the dimension 472 of the device-level contact 360E, but less than the dimension 4440 of the conductive line 394. In this instance, the dimension 444 is about the same as the distance 4450 between gate structures 350B and 350B'. Referring to FIG. 16C, and further referring to FIG. 13, the dimension 444 of the via feature 374 is still greater than the dimension 472 of the device-level contact 360E, but less than the dimension 4440 of the conductive line 394. In this instance, the dimension 444 is also greater than the distance 4450 between gate structures 350B and 350B'. In other words, the via feature 374 overhangs from edges of the device-level contacts 360E and is partially vertically over the dielectric feature 380. Accordingly, a vertical projection of the via feature 374 along the Z-direction onto a plane that extends along the top surface of the dielectric feature 380 overlaps with the top surface of the dielectric feature 380. In such a design, even if the etching operation that forms openings for the via feature 374 over etches into the ILD layer 353 and through the CESL layer 351, the via feature 374 lands on the dielectric feature 380 rather than any gate structures. Accordingly, shorting will not occur.

FIGS. 17A and 17B generally resemble FIGS. 14A and 14B, respectively, except that the via features 370 and 372 are also illustrated. Unlike FIG. 16C, where the dielectric features 380 provide safe landing area in case of over-etching in via opening formation, such over-etching will cause the via features 370 and 372 to be bridged with the underlaying gate structures 350D and 350A, respectively (see FIGS. 8 and 10, respectively). Accordingly, as described above with respect to FIGS. 14A and 14B, the via features 370 and 372 are each confined within the regions 500 and 502, respective. Therefore, the dimension 444 of the via feature 374 is greater than the dimension 404 of the via feature 370 and is greater than the dimension 424 of the via feature 372. In some embodiments, a ratio of the dimension 444 to the dimension 404 may be about 1.2:1 to about 3:1; and a ratio of the dimension 444 to the dimension 424 may be about 1.2:1 to about 3:1. If the ratios are too small, such as less than about 1.2:1, the resistance within the via feature 374 may not have been optimized and the device performance may not have been maximized. If the ratios are too large, such as greater than about 3:1, the reduction in resistance may have saturated and further increase in size no longer provide sufficient benefit to justify its cost. Moreover, unlike via features 374, the sidewall surfaces of the via features 370 and 372 along the X-direction, each extend to intersect with the gate structures 350D, 350A, respectively.

As described above, the present disclosure provides device structures that balance the competing needs for lower feature resistance and for minimizing leakage current. For example, the present disclosure recognizes that resistances of features on the source side and supply side are more impactful to the device performances. Accordingly, the present disclosure prioritizes the resistance optimization for via features 374. The memory cell 300 has certain characteristics. For example, the via feature 374 has a dimension along the X-direction that is substantially greater than via features 370 and 372. The via feature 374 has an aspect ratio that is about 1.2:1 to about 3:1, while the aspect ratio of the via features 370 and 372 are each about 0.8:1 to about 1.2:1. Moreover, the conductive line 394 is routed vertically over the dielectric features 380, and a width dimension of the conductive line 394 along the Y-direction is less than the width dimension of the dielectric features 380.

Though not intended to be limiting, embodiments of the present disclosure offer benefits for semiconductor processing and semiconductor devices, as compared to conventional devices. For example, the dimensions for the via feature 374 are greater than other approaches not implementing the structures provided herein. As a result, resistances within the via features 374 are lower, and current level is higher. Because the via feature 374 connects the source feature of an n-type device to a source supply voltage, the higher current level results in substantially higher device speed. Device characteristics are therefore improved. Meanwhile, due to the unique design of the present disclosure, the increased size of the via feature 374 does not increase the risk of forming bridge between the via features 374 and adjacent gate structures.

The present disclosure provides for many different embodiments. One general aspect includes a device. The device includes a semiconductor substrate, a device-level contact over the semiconductor substrate, and a first gate structure and a second gate structure over the semiconductor substrate. The first gate structure and the second gate structure are each adjacent the device-level contact and each extend along a first direction. The first gate structure is aligned lengthwise with the second gate structure. The device also includes a dielectric feature between the first gate structure and the second gate structure. The dielectric feature has a top surface extending along a first plane. A first sidewall of the dielectric feature defines an end-wall of the first gate structure. A second sidewall of the dielectric feature defines an end-wall of the second gate structure. The device further includes a conductive line extending along a second direction over the device-level contact and over the dielectric feature. A projection of the conductive line along a third direction onto the first plane passes between the first sidewall and the second sidewall of the dielectric feature, where the third direction extends perpendicular to the first plane. The device additionally includes a via feature vertically connecting the device-level contact and the conductive line. The via feature interfaces with the device-level contact along a second plane extending parallel to a top surface of the semiconductor substrate. The via feature has a first dimension along the second direction on the second plane, the device-level contact has a second dimension along the second direction on the second plane, and the first dimension is greater than the second dimension.

In some embodiments, a ratio of the first dimension to the second dimension is about 1.2:1 to about 3:1. In some embodiments, the conductive line has a third dimension along the second direction, and the first dimension is less than the third dimension. In some embodiments, the conductive line includes a first side surface extending in parallel to the first sidewall of the dielectric feature and along a first vertical surface. Moreover, the conductive line further includes a second side surface extending in parallel to the second sidewall of the dielectric feature and along a second vertical surface. The first vertical surface and the second vertical surface each extend between the first sidewall and the second sidewall of the dielectric feature. In some embodiments, a projection of the via feature along the third direction onto the first plane overlaps with the top surface of the dielectric feature. In some embodiments, the dielectric feature is a first dielectric feature. The device further includes a third gate structure and a fourth gate structure each extending adjacent the device-level contact and along the first direction. The third gate structure is aligned lengthwise with the fourth gate structure. Moreover, the device additionally includes a second dielectric feature between the third gate structure and the fourth gate structure. The second dielectric features has a top surface extending along the first plane. A third sidewall of the second dielectric feature defines an end-wall of the third gate structure, and a fourth sidewall of the second dielectric feature defines an end-wall of the fourth gate structure. Furthermore, the first dielectric feature and the second dielectric feature is separated by a first distance along the second direction. The first dimension is less than the first distance. In some embodiments, the third gate structure and the first gate structure is separated by a second distance. The second distance is less than the first dimension. In some embodiments, the conductive line is connected to a source supply voltage. In some embodiments, the via feature is a first via feature and the device-level contact is a first device-level contact. The device further includes a second via feature connecting a bit line and a second device-level contact. The second device-level contact has a fourth dimension along the second direction, the second via feature has a fifth dimension along the second direction, and the fifth dimension is not greater than the fourth dimension. In some embodiments, the conductive line is a first conductive line. Moreover, the device further includes a third via feature connecting a second conductive line and a third device-level contact. The second conductive line is connected to a drain power supply voltage. Furthermore, the third device-level contact has a sixth dimension along the second direction, the third via feature has a seventh dimension along the second direction, and the seventh dimension is not greater than the sixth dimension.

One general aspect includes a device. The device includes a first gate structure and a second gate structure over a semiconductor substrate. The first gate structure extends along a first direction, and the second gate structure extends in parallel to the first gate structure. The second gate structure has a top surface extending along a first plane. The device also includes a dielectric feature on an end-wall of the second gate structure. The dielectric feature has a top surface extending along the first plane and two side surfaces extending perpendicular to the first direction. The device further includes a first device-level contact and a second device-level contact. The first device-level contact has a first contact dimension along a second direction perpendicular to the first direction. The second device-level contact has a second contact dimension along the second direction. Moreover, the device includes a first via feature connecting the first device-level contact to a bit line, and a second via feature connecting the second device-level contact to a source supply voltage. The first via feature has a first via dimension along the second direction. Additionally, the first via feature has a first sidewall extending along a first plane perpendicular to the first direction and a second sidewall extending along a second plane perpendicular to the first direction. The second via feature has a second via dimension along the second direction. Additionally, the second via feature has a third sidewall extending along a third plane perpendicular to the first direction and a fourth sidewall extending along a fourth plane perpendicular to the first direction. The first plane and the second plane each intersects with the first gate structure, and the third plane and the fourth plane each pass between the first side surface and the second side surface. Still further, the first via dimension is less than the second via dimension.

In some embodiments, the second via feature has a third via dimension along the first direction. A ratio of the second via dimension to the third via dimension is about 1.2:1 to about 3:1. In some embodiments, a ratio of the second via dimension to the first via dimension is about 1.2:1 to about 3:1. In some embodiments, a vertical projection of the second via feature onto the first plane includes a portion interposed between the second gate structure and another gate structure along the first direction. In some embodiments, a projection along a third direction onto the first plane overlaps with the top surface of the dielectric feature. The third direction is perpendicular to the first direction and to the second direction. In some embodiments, the device further includes a conductive line connecting the second via feature to the source supply voltage. A size of the via feature matches the size of the conductive line. In some embodiments, the device also includes a third gate structure over the semiconductor substrate. The third gate structure extends in parallel to the first gate structure and further connected to the second gate structure. Moreover, the device includes a third device-level contact and a third via feature. The third device-level contact has a third contact dimension along the second direction. The third via feature connects the third device-level contact to a drain supply voltage. Furthermore, the third via feature has a fourth via dimension along the second direction. Still further, the third via feature has a fifth sidewall extending along a fifth plane perpendicular to the first direction and a sixth sidewall extending along a sixth plane perpendicular to the first direction. A ratio of the second via dimension to the fourth via dimension is about 1.2:1 to about 3:1. The fifth plane and the sixth plane each intersect with the third gate structure.

One general aspect includes a memory structure. The memory structure includes a semiconductor substrate, a pull-down transistor, a pull-up transistor, and a pass-gate transistor formed on the semiconductor substrate. The memory structure also includes a first via feature, a second via feature and a third via feature. The first via feature has a first dimension along a first direction and connects the pull-down transistor to a source supply voltage. The second via feature has a second dimension along a first direction and connects the pull-up transistor to a drain supply voltage. The third via feature has a third dimension along a first direction and connects the pass-gate transistor to a bit line. The first dimension is greater than the second dimension and the third dimension.

In some embodiments, the pull-down transistor includes a first gate structure that is aligned lengthwise along a second direction. The second direction is perpendicular to the first direction. The device further includes a gate-cut feature on an end-wall of the first gate structure. The first via feature has a first sidewall that extends along a first plane perpendicular to the second direction. The first via feature also has a second sidewall that extends along a second plane perpendicular to the second direction. Both the first plane and the second plane intersect with the gate-cut feature. In some embodiments, a projection of the first via feature overlaps with a top surface of the gate-cut feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a semiconductor substrate;
   a device-level contact over the semiconductor substrate;
   a first gate structure and a second gate structure each adjacent the device-level contact and each extending along a first direction over the semiconductor substrate, wherein the first gate structure is aligned lengthwise with the second gate structure;
   a dielectric feature between the first gate structure and the second gate structure and having a top surface extending along a first plane, wherein a first sidewall of the dielectric feature defines an end-wall of the first gate structure, and a second sidewall of the dielectric feature defines an end-wall of the second gate structure;
   a conductive line extending along a second direction over the device-level contact and over the dielectric feature, wherein a projection of the conductive line along a third direction onto the first plane passes between the first sidewall and the second sidewall of the dielectric feature, the third direction extending perpendicular to the first plane; and
   a via feature vertically connecting the device-level contact and the conductive line,
   wherein the via feature interfaces with the device-level contact along a second plane extending parallel to a top surface of the semiconductor substrate; and
   wherein the via feature has a first dimension along the second direction on the second plane, the device-level contact has a second dimension along the second direction on the second plane, and the first dimension is greater than the second dimension.

2. The device of claim 1, wherein a ratio of the first dimension to the second dimension is about 1.2:1 to about 3:1.

3. The device of claim 1, wherein the conductive line has a third dimension along the second direction, and wherein the first dimension is less than the third dimension.

4. The device of claim 1, wherein the conductive line includes a first side surface extending in parallel to the first sidewall of the dielectric feature and along a first vertical surface, and a second side surface extending in parallel to the second sidewall of the dielectric feature and along a second vertical surface, wherein the first vertical surface and the second vertical surface each extend between the first sidewall and the second sidewall of the dielectric feature.

5. The device of claim 1, wherein a projection of the via feature along the third direction onto the first plane overlaps with the top surface of the dielectric feature.

6. The device of claim 1, wherein the dielectric feature is a first dielectric feature, the device further comprising:
   a third gate structure and a fourth gate structure each extending adjacent the device-level contact and along the first direction, wherein the third gate structure is aligned lengthwise with the fourth gate structure; and
   a second dielectric feature between the third gate structure and the fourth gate structure and having a top surface extending along the first plane, wherein a third sidewall of the second dielectric feature defines an end-wall of the third gate structure, and a fourth sidewall of the second dielectric feature defines an end-wall of the fourth gate structure,
   wherein the first dielectric feature and the second dielectric feature is separated by a first distance along the second direction, and wherein the first dimension is less than the first distance.

7. The device of claim 6, wherein the third gate structure and the first gate structure are separated by a second distance, and the second distance is less than the first dimension.

8. The device of claim 1, wherein the conductive line is connected to a source supply voltage.

9. The device of claim 1, wherein the via feature is a first via feature and the device-level contact is a first device-level contact, the device further comprising a second via feature connecting a bit line and a second device-level contact,
   wherein the second device-level contact has a fourth dimension along the second direction, the second via feature has a fifth dimension along the second direction, and
   wherein the fifth dimension is not greater than the fourth dimension.

10. The device of claim 9, wherein the conductive line is a first conductive line, the device further comprising a third via feature connecting a second conductive line and a third device-level contact, the second conductive line connected to a drain power supply voltage,
   wherein the third device-level contact has a sixth dimension along the second direction, the third via feature has a seventh dimension along the second direction, and wherein the seventh dimension is not greater than the sixth dimension.

11. A device, comprising:
a first gate structure over a semiconductor substrate extending along a first direction;
a second gate structure over the semiconductor substrate extending in parallel to the first gate structure and having a top surface extending along a first plane;
a dielectric feature on an end-wall of the second gate structure and having a top surface extending along the first plane and two side surfaces extending perpendicular to the first direction;
a first device-level contact having a first contact dimension along a second direction perpendicular to the first direction;
a second device-level contact having a second contact dimension along the second direction;
a first via feature connecting the first device-level contact to a bit line, the first via feature having a first via dimension along the second direction and having a first sidewall extending along a first plane perpendicular to the first direction and a second sidewall extending along a second plane perpendicular to the first direction; and
a second via feature connecting the second device-level contact to a source supply voltage, the second via feature having a second via dimension along the second direction and having a third sidewall extending along a third plane perpendicular to the first direction and a fourth sidewall extending along a fourth plane perpendicular to the first direction,
wherein the first plane and the second plane each intersects with the first gate structure, and the third plane and the fourth plane each pass between the first side surface and the second side surface, and
wherein the first via dimension is less than the second via dimension.

12. The device of claim 11, wherein the second via feature has a third via dimension along the first direction, and wherein a ratio of the second via dimension to the third via dimension is about 1.2:1 to about 3:1.

13. The device of claim 11, wherein a ratio of the second via dimension to the first via dimension is about 1.2:1 to about 3:1.

14. The device of claim 11, wherein a vertical projection of the second via feature onto the first plane includes a portion interposed between the second gate structure and another gate structure along the first direction.

15. The device of claim 11, wherein a projection along a third direction onto the first plane overlaps with the top surface of the dielectric feature, the third direction being perpendicular to the first direction and to the second direction.

16. The device of claim 11, further comprising a conductive line connecting the second via feature to the source supply voltage, wherein a size of the via feature matches the size of the conductive line.

17. The device of claim 11, further comprising:
a third gate structure over the semiconductor substrate, extending in parallel to the first gate structure and further connected to the second gate structure;
a third device-level contact having a third contact dimension along the second direction; and
a third via feature connecting the third device-level contact to a drain supply voltage, the third via feature having a fourth via dimension along the second direction and having a fifth sidewall extending along a fifth plane perpendicular to the first direction and a sixth sidewall extending along a sixth plane perpendicular to the first direction,
wherein a ratio of the second via dimension to the fourth via dimension is about 1.2:1 to about 3:1, and
wherein the fifth plane and the sixth plane each intersect with the third gate structure.

18. A memory structure, comprising:
a semiconductor substrate;
a pull-down transistor, a pull-up transistor, and a pass-gate transistor formed on the semiconductor substrate;
a first via feature having a first dimension along a first direction and connecting the pull-down transistor to a source supply voltage;
a second via feature having a second dimension along the first direction and connecting the pull-up transistor to a drain supply voltage;
a third via feature having a third dimension along the first direction and connecting the pass-gate transistor to a bit line; and
a gate-cut feature,
wherein the first dimension is greater than the second dimension and the third dimension,
wherein the pull-down transistor and the pull-up transistor share a gate structure that extends lengthwise along a second direction perpendicular to the first direction,
wherein the gate-cut feature is disposed on an end-wall of the gate structure,
wherein the first via feature has a first sidewall that extends along a first plane perpendicular to the second direction and a second sidewall that extends along a second plane perpendicular to the second direction, both the first plane and the second plane intersect with the gate-cut feature.

19. The memory structure of claim 18, wherein a projection of the first via feature overlaps with a top surface of the gate-cut feature.

20. The memory structure of claim 18,
wherein the pull-down transistor and the pass-gate transistor share at least one fin-shaped structure,
wherein the at least one fin-shaped structure extends lengthwise along the first direction.

* * * * *